US007250101B2

(12) United States Patent
Thompson et al.

(10) Patent No.: US 7,250,101 B2
(45) Date of Patent: Jul. 31, 2007

(54) ELECTROCHEMICALLY FABRICATED STRUCTURES HAVING DIELECTRIC OR ACTIVE BASES AND METHODS OF AND APPARATUS FOR PRODUCING SUCH STRUCTURES

(75) Inventors: Jeffrey A. Thompson, Burbank, CA (US); Adam L. Cohen, Los Angeles, CA (US); Michael S. Lockard, Lake Elizabeth, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 10/434,493

(22) Filed: May 7, 2003

(65) Prior Publication Data

US 2004/0004002 A1 Jan. 8, 2004

Related U.S. Application Data

(60) Provisional application No. 60/442,656, filed on Jan. 23, 2003, provisional application No. 60/379,177, filed on May 7, 2002.

(51) Int. Cl.
*C25D 1/00* (2006.01)
*C25D 5/02* (2006.01)
*C25D 5/48* (2006.01)
*C25D 5/52* (2006.01)

(52) U.S. Cl. .......... 205/67; 205/118; 205/220; 205/221; 205/222; 205/223

(58) Field of Classification Search ........... 205/67, 205/118, 220, 221, 222, 223
See application file for complete search history.

(56) References Cited

U.S. PATENT DOCUMENTS 3,909,332 A * 9/1975 Yerman .................. 438/406

(Continued)

FOREIGN PATENT DOCUMENTS

GB 792920 * 4/1958

(Continued)

OTHER PUBLICATIONS

Cohen et al., "EFAB: Rapid, low-cost desktop micromachining of high aspect ratio true 3-D MEMS," 12th IEEE International Conference on Microelectromechanical Systems, pp. 244-251 (Jan. 17-21, 1999).*

(Continued)

*Primary Examiner*—Edna Wong
(74) *Attorney, Agent, or Firm*—Dennis R. Smalley

(57) ABSTRACT

Multilayer structures are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are form from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multilayer structure may be released from a sacrificial material prior to attaching the permanent substrate or it may be released after attachment.

30 Claims, 27 Drawing Sheets

U.S. PATENT DOCUMENTS

| | | | | |
|---|---|---|---|---|
| 4,306,925 | A * | 12/1981 | Lebow et al. | 156/150 |
| 5,106,461 | A * | 4/1992 | Volfson et al. | 205/125 |
| 5,190,637 | A * | 3/1993 | Guckel | 205/118 |
| 5,829,128 | A | 11/1998 | Eldridge et al. | 29/855 |
| 5,891,285 | A | 4/1999 | Nakayama | 156/150 |
| 5,917,707 | A | 6/1999 | Khandros et al. | 361/776 |
| 5,989,994 | A | 11/1999 | Khoury et al. | 438/616 |
| 6,002,179 | A * | 12/1999 | Chan et al. | 257/781 |
| 6,027,630 | A * | 2/2000 | Cohen | 205/135 |
| 6,043,563 | A | 3/2000 | Eldridge et al. | 257/784 |
| 6,166,915 | A * | 12/2000 | Lake et al. | 361/748 |
| 6,255,126 | B1 | 7/2001 | Mathieu et al. | 438/15 |
| 6,268,015 | B1 | 7/2001 | Mathieu et al. | 430/313 |
| 6,287,891 | B1 * | 9/2001 | Sayyah | 438/106 |
| 6,369,464 | B1 | 4/2002 | Khoury | 324/754 |
| 6,491,968 | B1 | 12/2002 | Mathieu et al. | 29/842 |
| 6,572,742 | B1 | 6/2003 | Cohen | 204/297.5 |
| 6,586,955 | B2 | 7/2003 | Fjelstad et al. | 324/754 |
| 6,627,980 | B2 | 9/2003 | Eldridge | 257/678 |
| 6,672,875 | B1 | 1/2004 | Mathieu et al. | 439/66 |
| 6,727,579 | B1 | 4/2004 | Eldridge et al. | 257/692 |
| 6,827,584 | B2 | 12/2004 | Mathieu et al. | 439/66 |
| 7,047,638 | B2 | 5/2006 | Eldridge et al. | 29/884 |
| 2003/0127336 | A1 | 7/2003 | Cohen, et al. | 205/118 |
| 2003/0221968 | A1 | 12/2003 | Cohen, et al. | 205/118 |
| 2003/0222738 | A1 | 12/2003 | Brown, et al. | 333/160 |
| 2003/0234179 | A1 | 12/2003 | Bang | 205/118 |
| 2004/0000489 | A1 | 1/2004 | Zhang, et al. | 205/118 |
| 2004/0004001 | A1 | 1/2004 | Cohen, et al. | 205/118 |
| 2004/0007468 | A1 | 1/2004 | Cohen, et al. | 205/118 |
| 2004/0007470 | A1 | 1/2004 | Smalley | 205/118 |
| 2004/0020782 | A1 | 2/2004 | Cohen, et al. | 205/220 |
| 2004/0065550 | A1 | 4/2004 | Zhang | 205/135 |
| 2004/0065555 | A1 | 4/2004 | Zhang | 205/118 |
| 2004/0144653 | A1 * | 7/2004 | Jerominek et al. | 205/67 |
| 2005/0067292 | A1 * | 3/2005 | Thompson et al. | 205/118 |

FOREIGN PATENT DOCUMENTS

| | | |
|---|---|---|
| JP | 07-323654 | 12/1995 |
| JP | 09-279365 | 10/1997 |

OTHER PUBLICATIONS

Cohen et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, pp. 244-251.*

Cohen, et al., "EFAB: Batch Production of Functional, Fully-Dense Metal Parts with Micron-Scale Features", Proc. 9th Solid Freeform Fabrication, the University of Texas at Austin, Aug. 1998, p. 161.

Adam L. Cohen, et al., "EFAB: Rapid, Low-Cost Desktop Micromachining of high Aspect Ratio True 3-D MEMS", Proc. 12th IEEE Micro Electro Mechanical Systems Workshop, IEEE, Jan. 1999, p. 244.

"Microfabrication - Rapid Prototyping's Killer Application", Rapid Prototyping Report, CAD/CAM Publishing, Inc. Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ration Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23. no month.

* cited by examiner

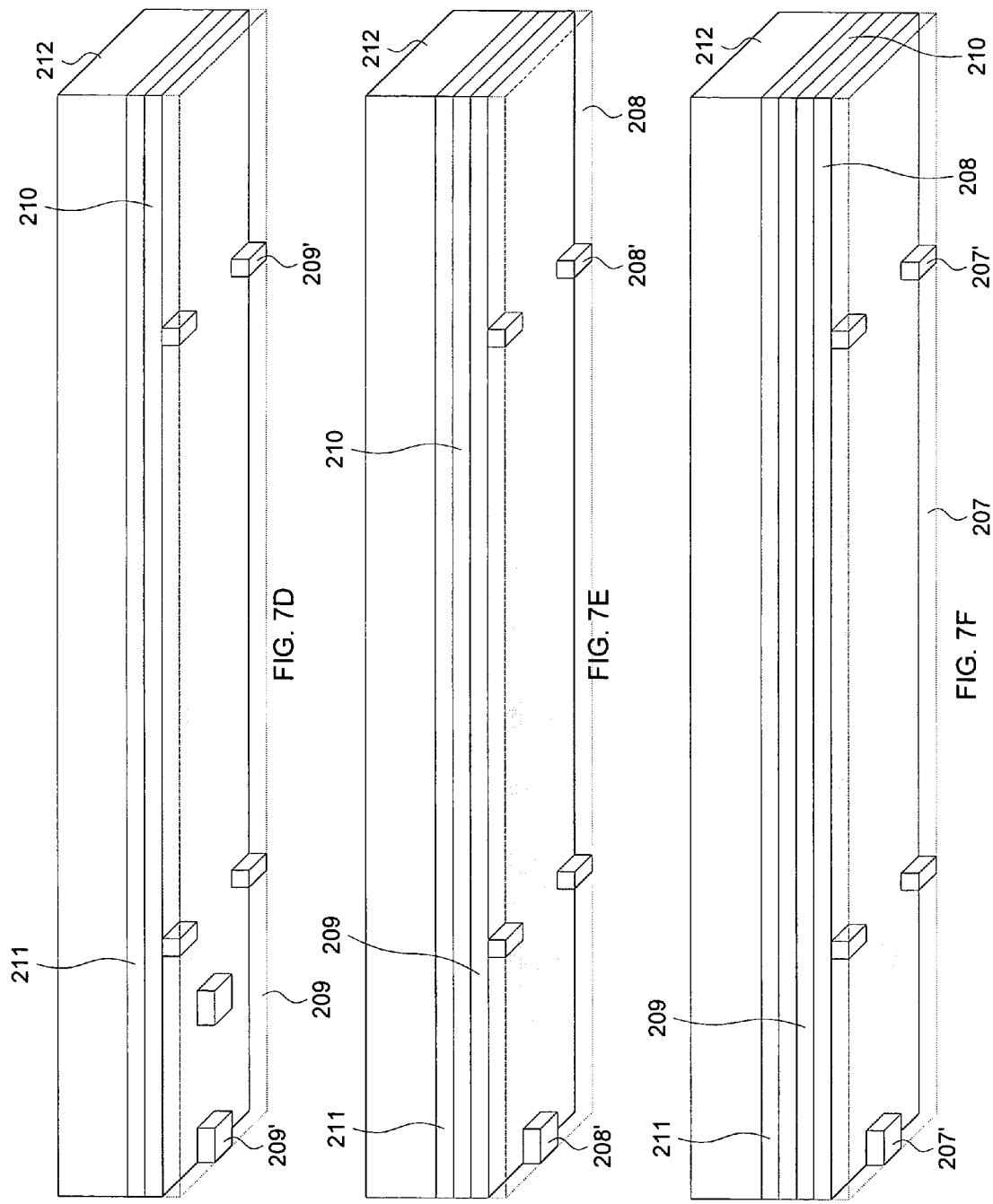

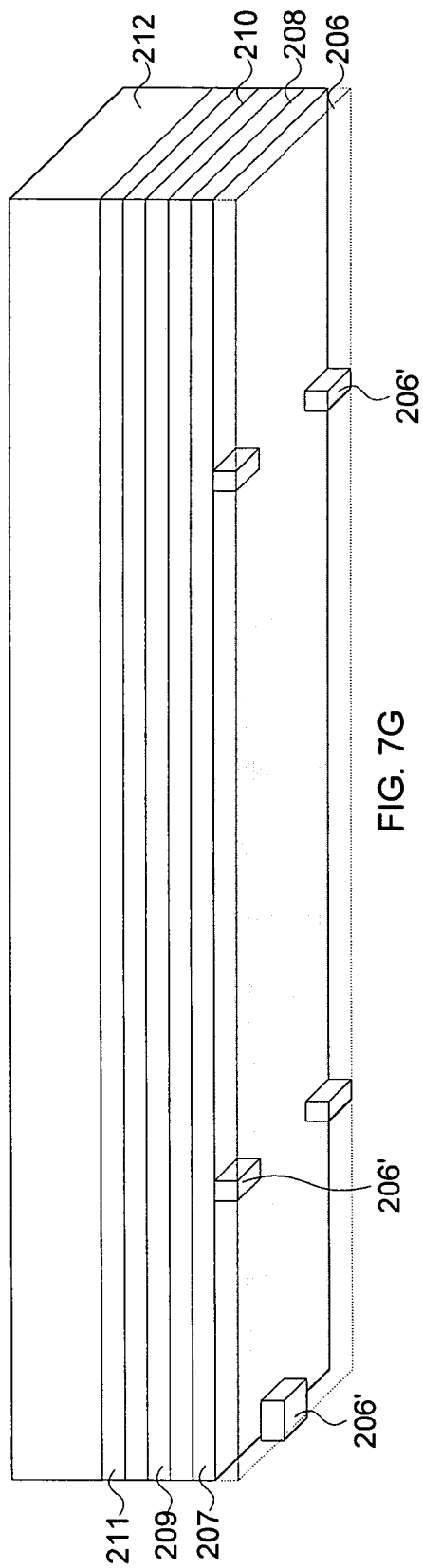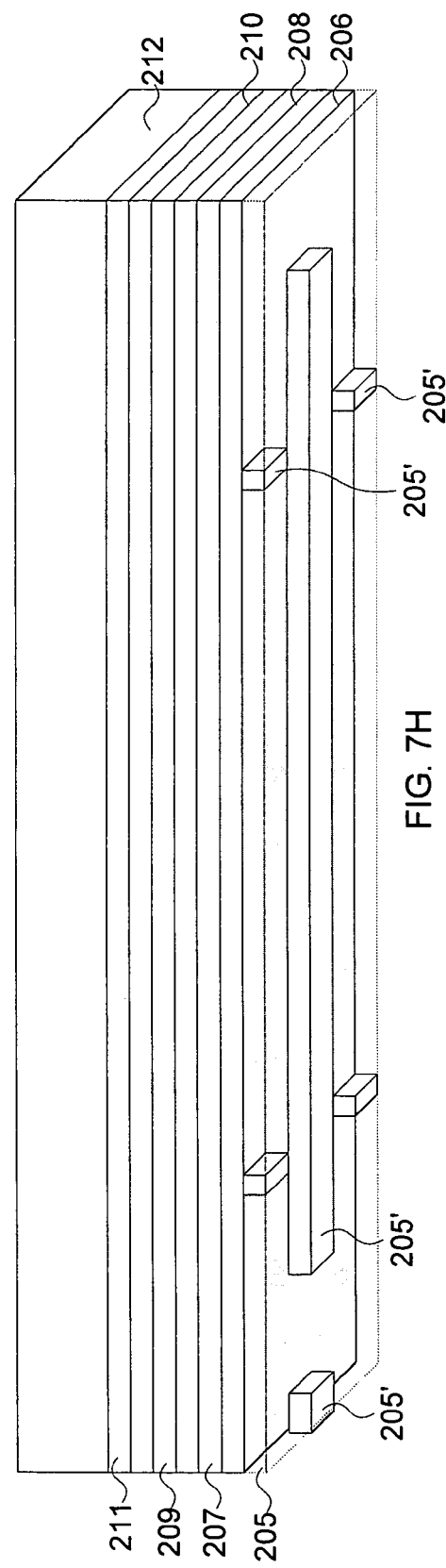
FIG. 7G
FIG. 7H

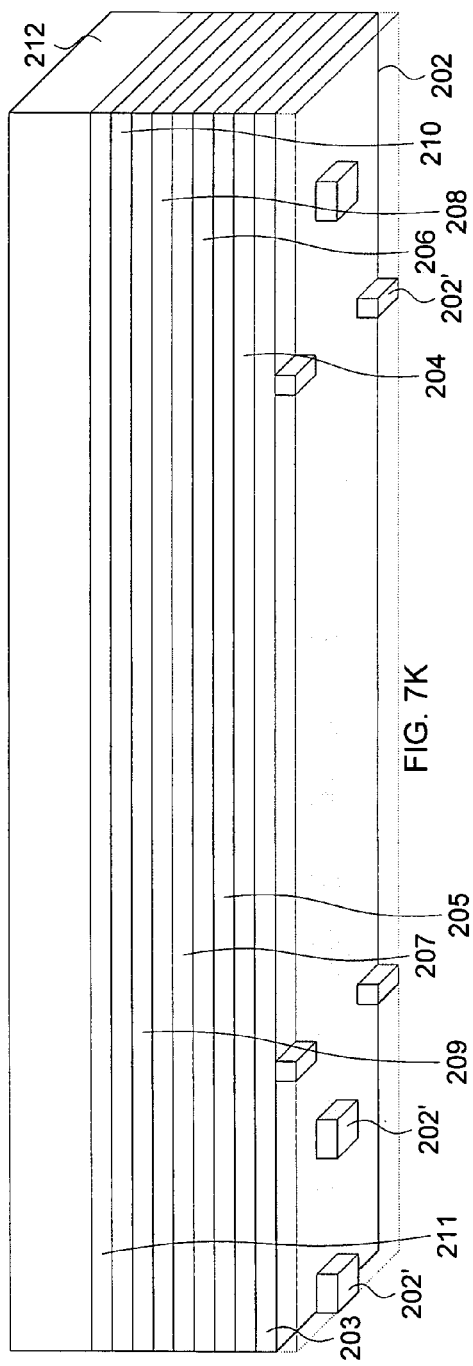
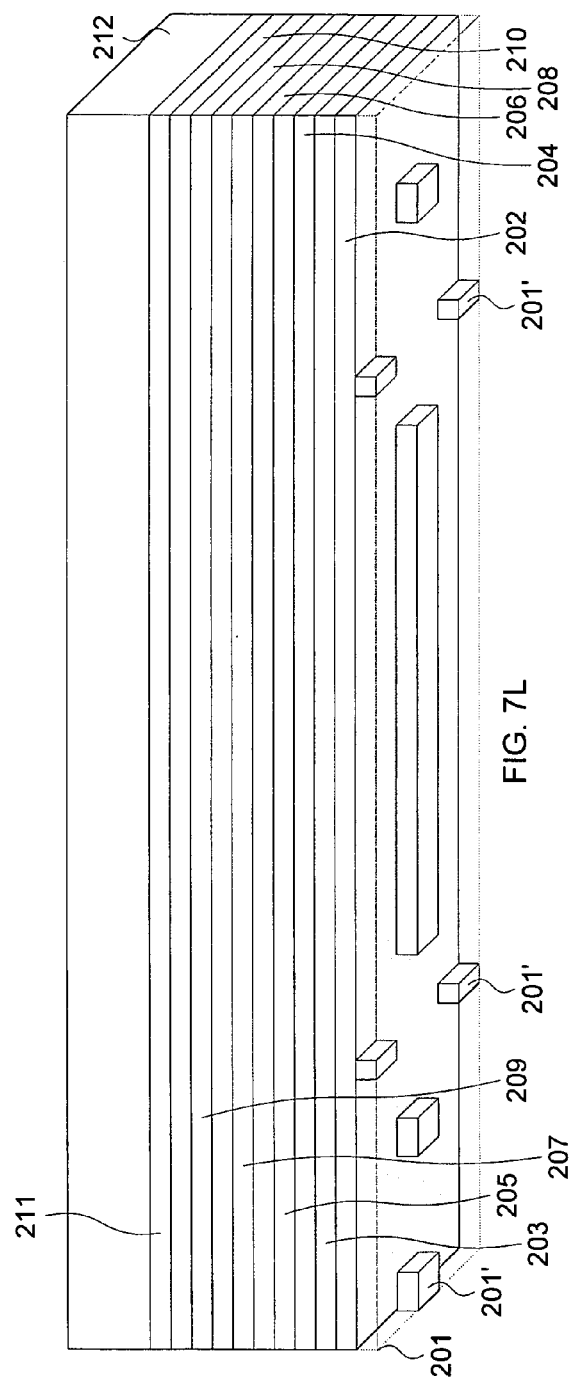

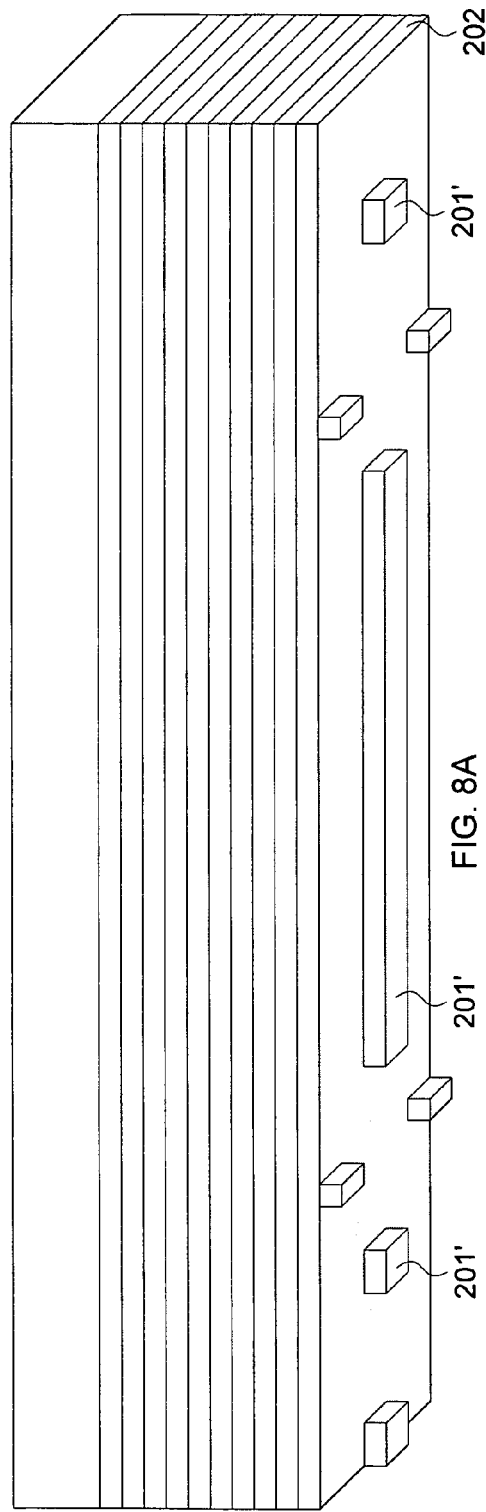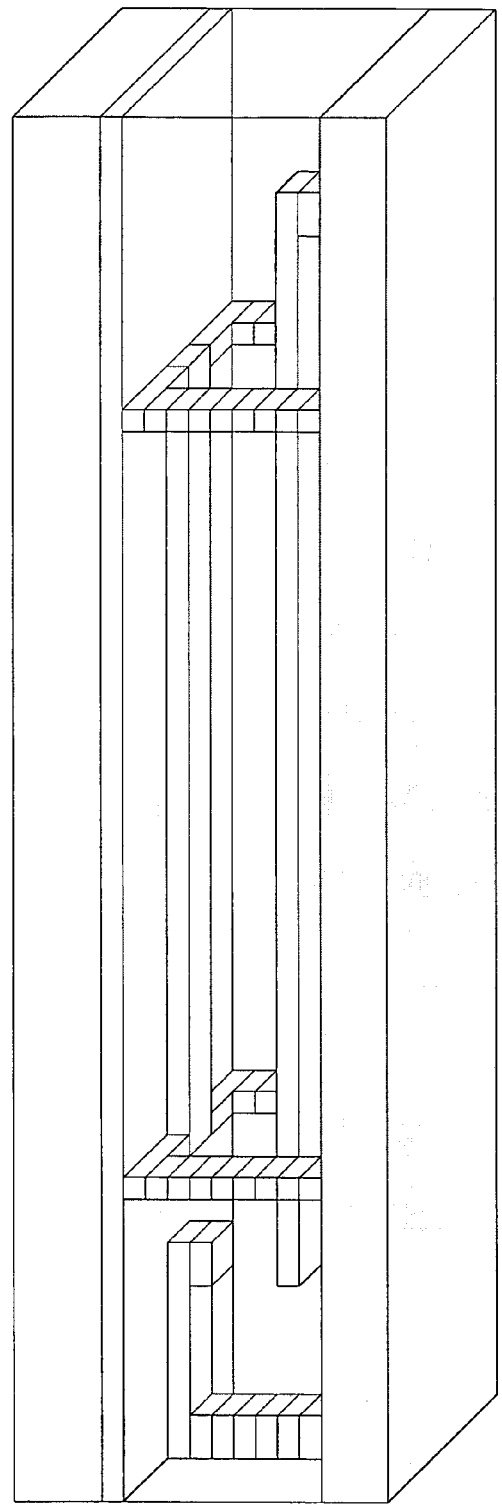
FIG. 8A
FIG. 8B

ELECTROCHEMICALLY FABRICATED STRUCTURES HAVING DIELECTRIC OR ACTIVE BASES AND METHODS OF AND APPARATUS FOR PRODUCING SUCH STRUCTURES

RELATED APPLICATIONS

This application claims benefit of U.S. Provisional Patent Application Nos. 60/379,177, filed on May 7, 2002, and 60/442,656, filed on Jan. 23, 2003, both of which are hereby incorporated herein by reference as if set forth in full.

FIELD OF THE INVENTION

The present invention relates generally to the field of electrochemical fabrication and the associated formation of three-dimensional structures (e.g. parts, objects, components, or devices) via a layer-by-layer build up of deposited materials and to the processing of such structures after layer formation is complete so that the structures are transferred from a build substrate (i.e. temporary substrate) to a structural substrate.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFAB™)", Chapter 19 of The MEMS Handbook, edited by Mohamed Gad-EI-Hak, CRC Press, 2002.
9. "Microfabrication—Rapid Prototyping's Killer Application", pages 1–5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A–1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D–1G. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A–2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A–3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

In addition to the above teachings, the '630 patent indicates that electroplating methods can be used in combination with insulating materials. In particular it indicates that though the electroplating methods have been described with respect to two metals, a variety of materials, e.g., polymers, ceramics and semiconductor materials, and any number of metals can be deposited either by the electroplating methods described above, or in separate processes that occur throughout the electroplating method. It further indicates that a thin plating base can be deposited, e.g., by sputtering, over a deposit that is insufficiently conductive (e.g., an insulating layer) so as to enable continued electroplating.

A need still exists in the field for enhancing the combinability of conducting materials, dielectric materials, semiconducting materials, other materials, processed or configured materials within the EFAB process. Furthermore, a need exists in the field for combining electrochemically fabricated structures with dielectric bases or substrates, active bases or substrates (bases or substrates having elements that interact with the structure or that serve a purpose other than merely as a mount for the structure), and/or bases or substrates containing contoured structures. A need remains in the field for improved adhesion between bases or substrates and electrochemically fabricated structures. A need remains in the field for extending the range of capabilities and in particular for expanding the range of materials and processes available for forming desired structures (including their bases or substrates).

SUMMARY OF THE INVENTION

It is an object of various aspects of the present invention to supplement electrochemical fabrication techniques to expand the capabilities of electrochemical fabrication process to meet the structural and functional requirements for varying applications and thus to expand the potential applications available to the technology.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

A first aspect of the invention provides an electrochemical fabrication process for producing a three-dimensional structure from a plurality of adhered layers, the process including: (A) selectively depositing at least a portion of a layer onto a temporary substrate, wherein the temporary substrate may include previously deposited material; (B) forming a plurality of layers such that successive layers are formed adjacent to and adhered to previously deposited layers, wherein said forming includes repeating operation (A) a plurality of times; (C) after formation of a plurality of layers, attaching a structural substrate including a dielectric material to at least a portion of a layer of the structure and removing at least a portion of the temporary substrate from the structure.

A second aspect of the invention provides an electrochemical fabrication apparatus for producing a three-dimensional structure from a plurality of adhered layers, the apparatus including: (A) means for selectively depositing at least a portion of a layer onto a temporary substrate, wherein the temporary substrate may include previously deposited material; and (B) means for forming a plurality of layers such that successive layers are formed adjacent to and adhered to previously deposited layers, wherein said forming includes repeating operation (A) a plurality of times; (C) means for attaching a structural substrate including a dielectric material to at least a portion of a layer of the structure and removing at least a portion of the temporary substrate from the structure; and (D) a computer programmed to control the means for contacting, the means for conducting, the means for separating, and the means for attaching, such that the means for attaching is made to operate after formation of a plurality of layers of the structure.

A third aspect of the invention provides an electrochemical fabrication process for producing a three-dimensional structure from a plurality of adhered layers, the process including: (A) selectively depositing at least a portion of a layer onto a first temporary substrate, wherein the first temporary substrate may include previously deposited material; and (B) forming a plurality of layers such that successive layers are formed adjacent to and adhered to previously deposited layers; and (C) after formation of a plurality of layers attaching a second temporary substrate, which includes a dielectric material, to at least a portion of a layer of the structure and removing at least a portion of the first temporary substrate from the structure and then attaching a structural substrate to at least a portion of a layer of the structure that at least partially overlaps a location where the first temporary substrate was attached.

A third aspect of the invention provides an electrochemical fabrication process for producing a three-dimensional structure from a plurality of adhered layers, the process including: (A) selectively depositing at least a portion of a layer onto a sacrificial substrate, wherein the temporary substrate may include previously deposited material; (B) forming a plurality of layers such that each successive layer is formed adjacent to and adhered to a previously deposited layer, wherein said forming includes repeating operation (A) a plurality of times; (C) after formation of a plurality of layers attaching a structural substrate, including a plurality of materials and/or a patterned structure, to at least a portion of a layer of the structure and removing at least a portion of the temporary substrate from the structure.

A fourth aspect of the invention provides an electrochemical fabrication process for producing a three-dimensional structure from a plurality of adhered layers, the process including: (A) selectively depositing at least a portion of a layer onto a first temporary substrate, wherein the first temporary substrate may include previously deposited material; and (B) forming a plurality of layers such that successive layers are formed adjacent to and adhered to previously deposited layers; and (C) after formation of a plurality of layers attaching a second temporary substrate, which includes a plurality of materials and/or includes a patterned structure, to at least a portion of a layer of the structure and removing at least a portion of the first temporary substrate from the structure and then attaching a structural substrate to at least a portion of a layer of the structure that at least partially overlaps a location where the first temporary substrate was attached.

A fifth aspect of the invention provides an electrochemical fabrication process for producing a multi-part three-dimensional structure wherein at least one part is produced from a plurality of adhered layers, the process including: (A) forming at least one part of the multi-part structure, including: (1) selectively depositing at least a portion of a layer onto a substrate, wherein the substrate may include previously deposited material; (2) forming a plurality of layers such that successive layers are formed adjacent to and adhered to previously deposited layers, wherein said forming includes repeating operation (1) a plurality of times; (B) supplying at least one additional part of the multi-part structure; (C) attaching the at least one part to the at least one additional part to form the multi-part structure.

Further aspects of the invention will be understood by those of skill in the art upon reviewing the teachings herein. Other aspects of the invention may involve combinations of the above noted aspects of the invention and/or addition of various features of one or more embodiments. Other aspects of the invention may involve apparatus that can be used in implementing one or more of the above method aspects of the invention. These other aspects of the invention may involve various combinations of the aspects presented above, addition of various features of one or more embodiments, as well as other configurations, structures, functional relationships, and processes that have not been specifically set forth above.

BRIEF DESCRIPTION OF THE DRAWINGS

FIGS. 6A and 6B depict two different perspective views of the structure while FIG. 6C depicts a side view of the structure of FIGS. 6A and 6B.

FIGS. 8A–8D illustrate a variation to the formation of the last layer of the structure of FIGS. 6A–6C and how the permanent substrate mates with that layer.

DETAILED DESCRIPTION

FIGS. 1A–1G, 2A–2F, and 3A–3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
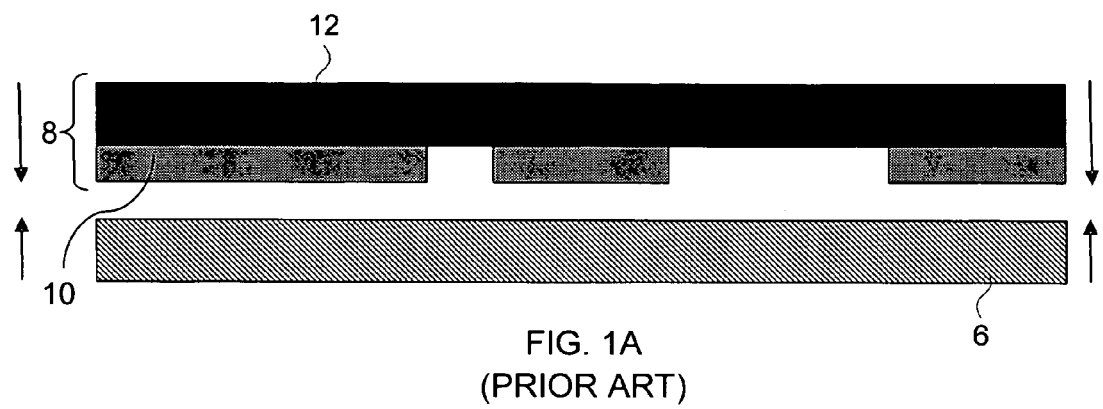
FIGS. 1A–1C schematically depict side views of various stages of a CC mask plating process, while FIGS. 1D–1G schematically depict a side views of various stages of a CC mask plating process using a different type of CC mask.
Figure 1B:
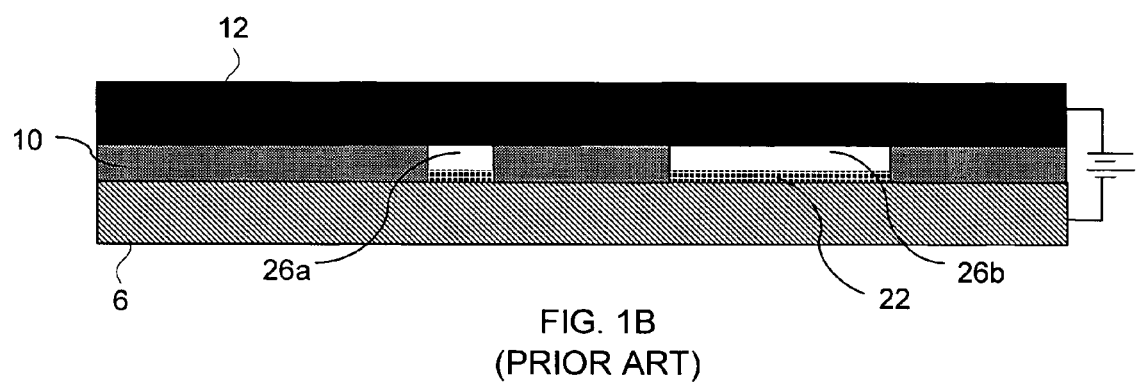
Figure 1C:
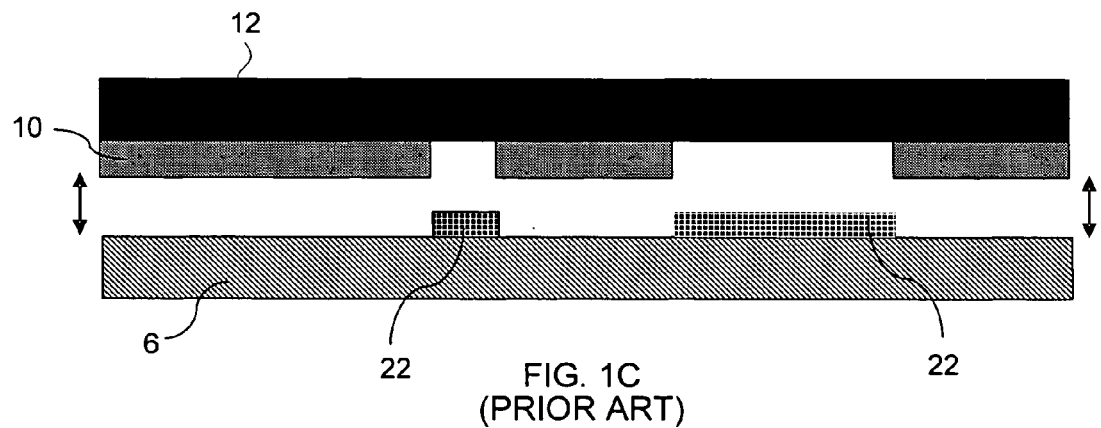
Figure 1D:
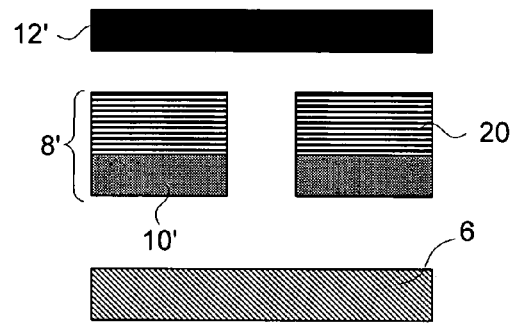
Figure 1E:
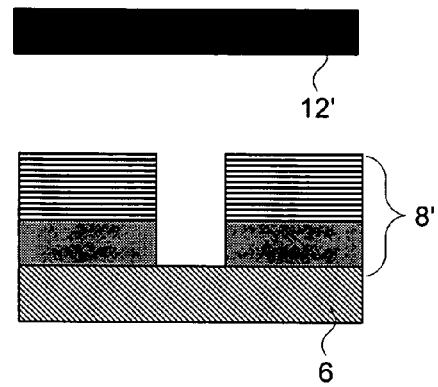
Figure 1F:
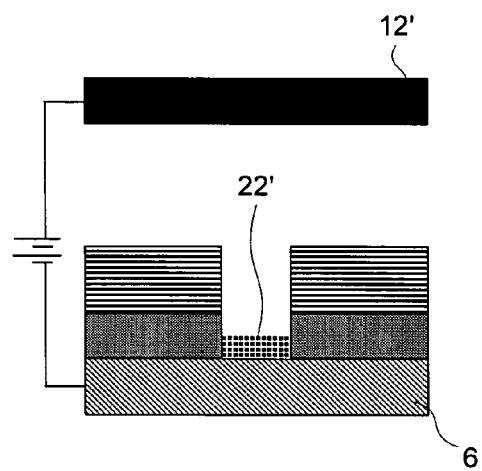
Figure 1G:
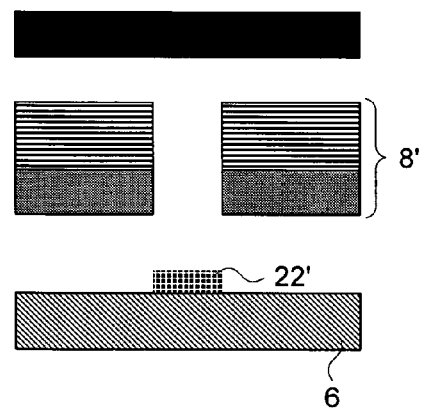
Figure 2A:
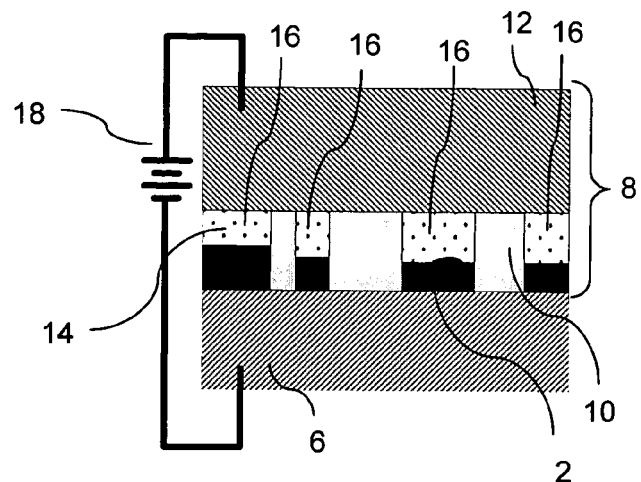
FIGS. 2A–2F schematically depict side views of various stages of an electrochemical fabrication process as applied to the formation of a particular structure where a sacrificial material is selectively deposited while a structural material is blanket deposited.
Figure 2B:
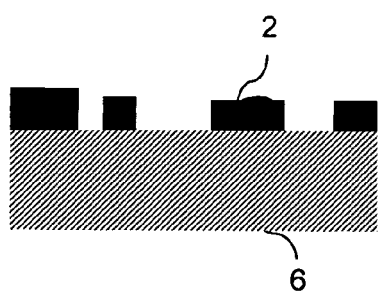
Figure 2C:
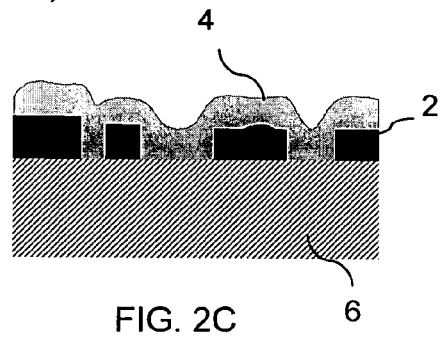
Figure 2D:
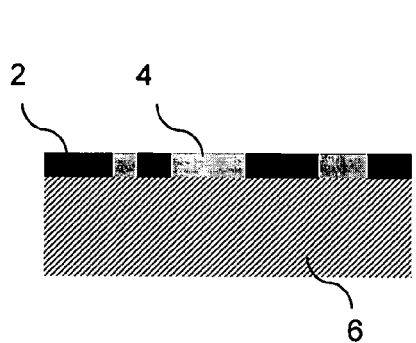
Figure 2E:
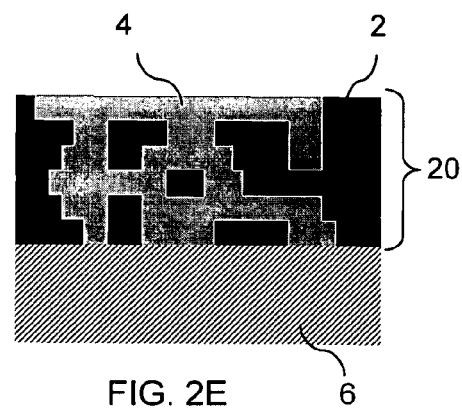
Figure 2F:
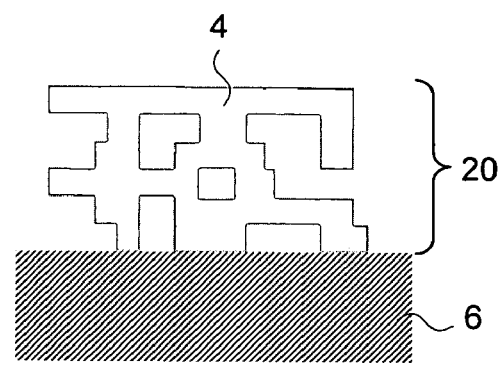
Figure 3A:
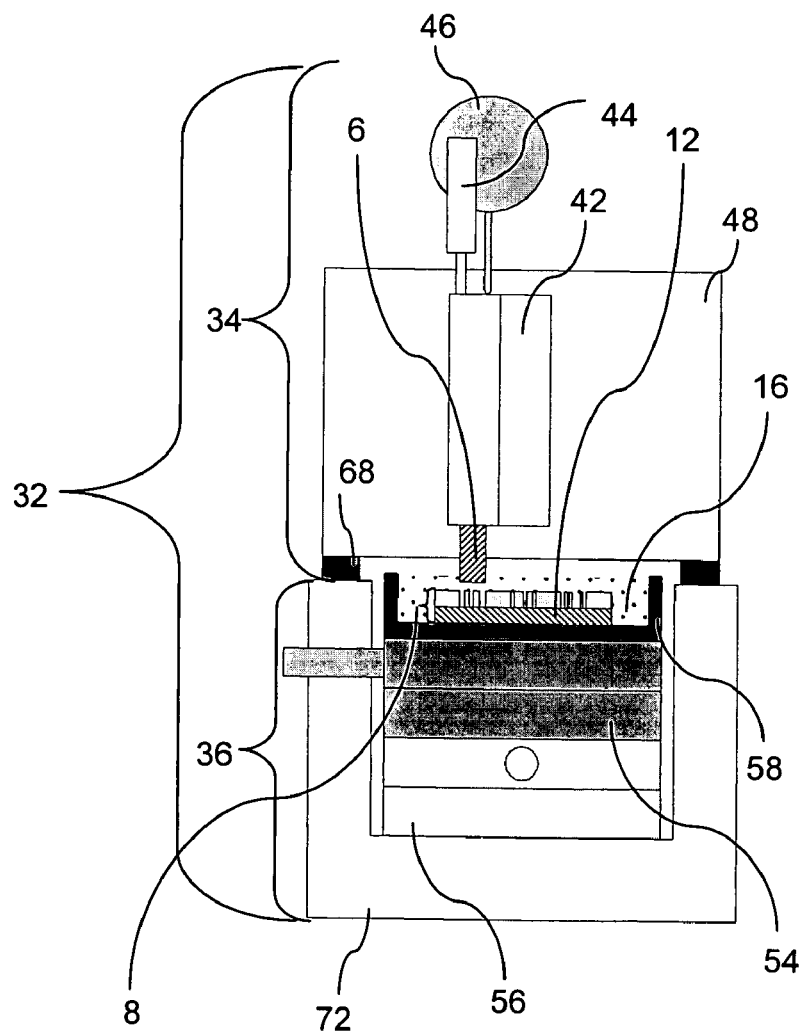
FIGS. 3A–3C schematically depict side views of various example subassemblies that may be used in manually implementing the electrochemical fabrication method depicted in FIGS. 2A–2F.
Figure 3B:
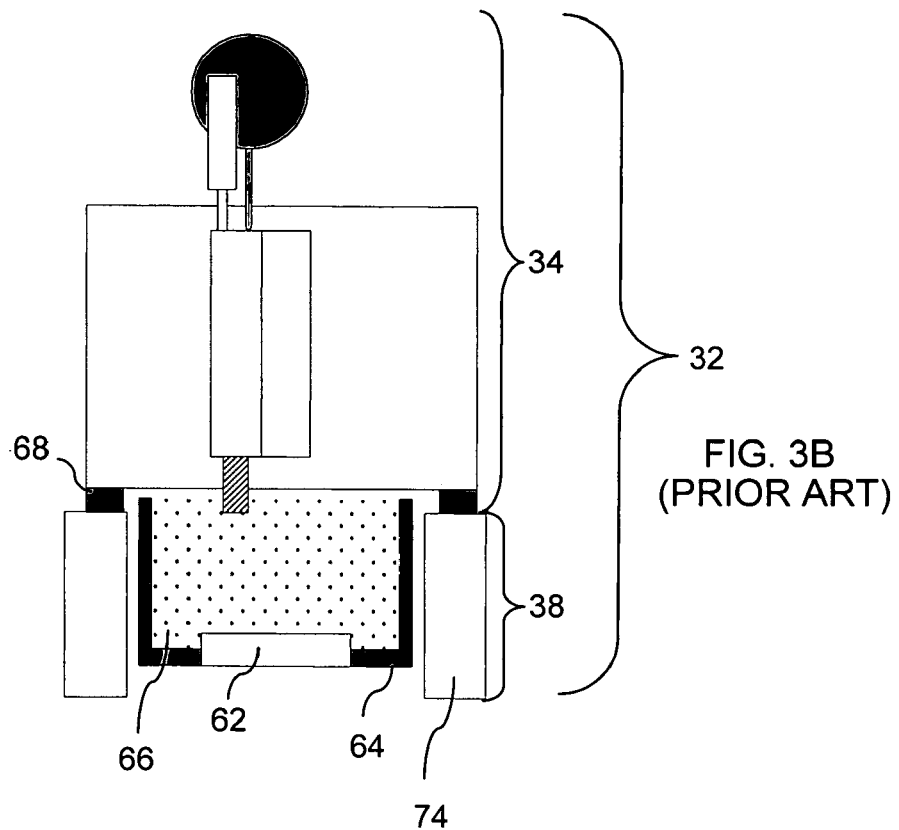
Figure 3C:
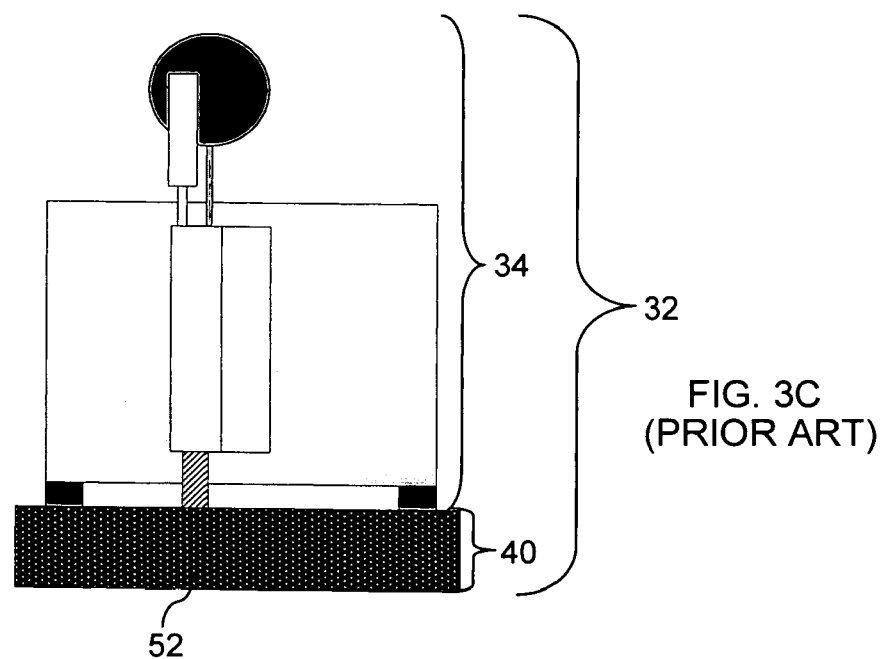
Figure 4A:
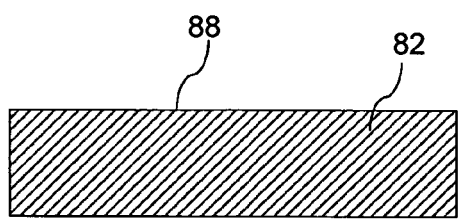
FIGS. 4A–4F schematically depict the formation of a first layer of a structure using adhered mask plating where the blanket deposition of a second material overlays both the openings between deposition locations of a first material and the first material itself.
Figure 4B:
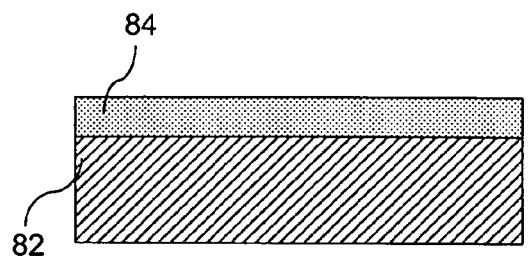
Figure 4C:
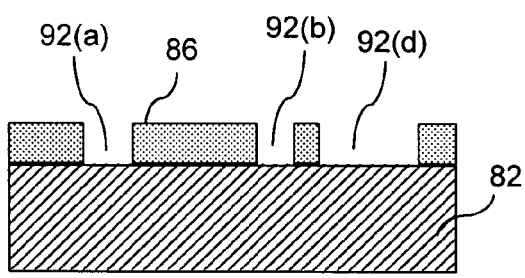
Figure 4D:
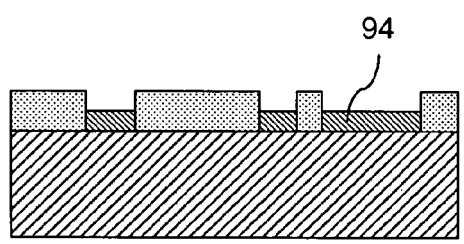
Figure 4E:
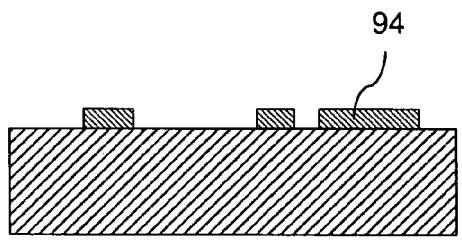
Figure 4F:
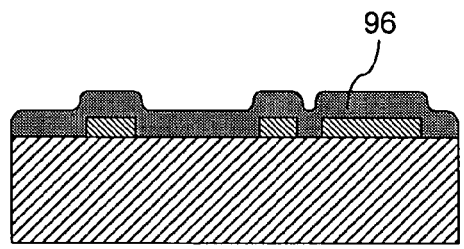
Figure 4G:
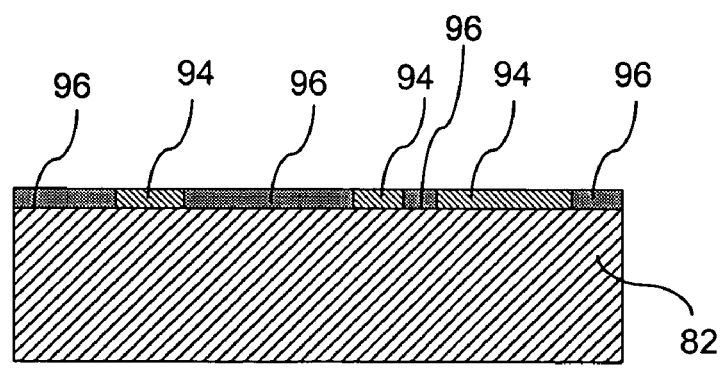
FIG. 4G depicts the completion of formation of the first layer resulting from planarizing the deposited materials to a desired level.
Figure 4H:
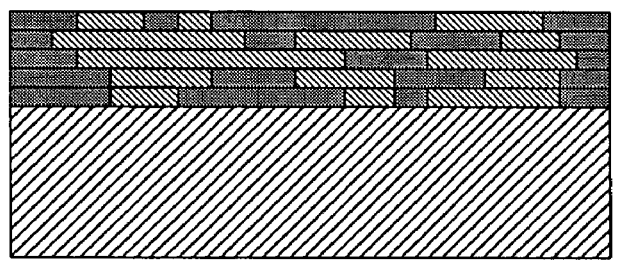
FIGS. 4H and 4I respectively depict the state of the process after formation of the multiple layers of the structure and after release of the structure from the sacrificial material.
Figure 4I:
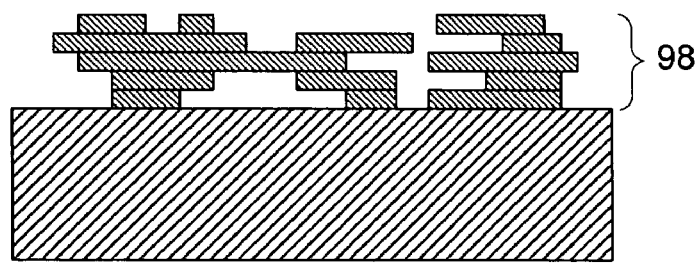

FIGS. 4A–4F illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown onto which patternable photoresist 84 is cast as shown in FIG. 4B. In FIG. 4C a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4D a metal 94 (e.g. nickel) is shown as having been electroplated into the openings 92(a)–92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B–4G several times to form a multi-layer structure is shown where each layer consists of two materials. For most applications, one of these materials is removed as shown in FIG. 4I to yield a desired 3-D structure 98 (e.g. component or device).

Though the embodiments discussed herein are primarily focused on conformable contact masks and masking operations, the various embodiments, alternatives, and techniques disclosed herein may have application to proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and adhered masks and masking operations (masks and operations that use masks that are adhered to a substrate onto which selective deposition or etching is to occur as opposed to only being contacted to it).

Figure 5:
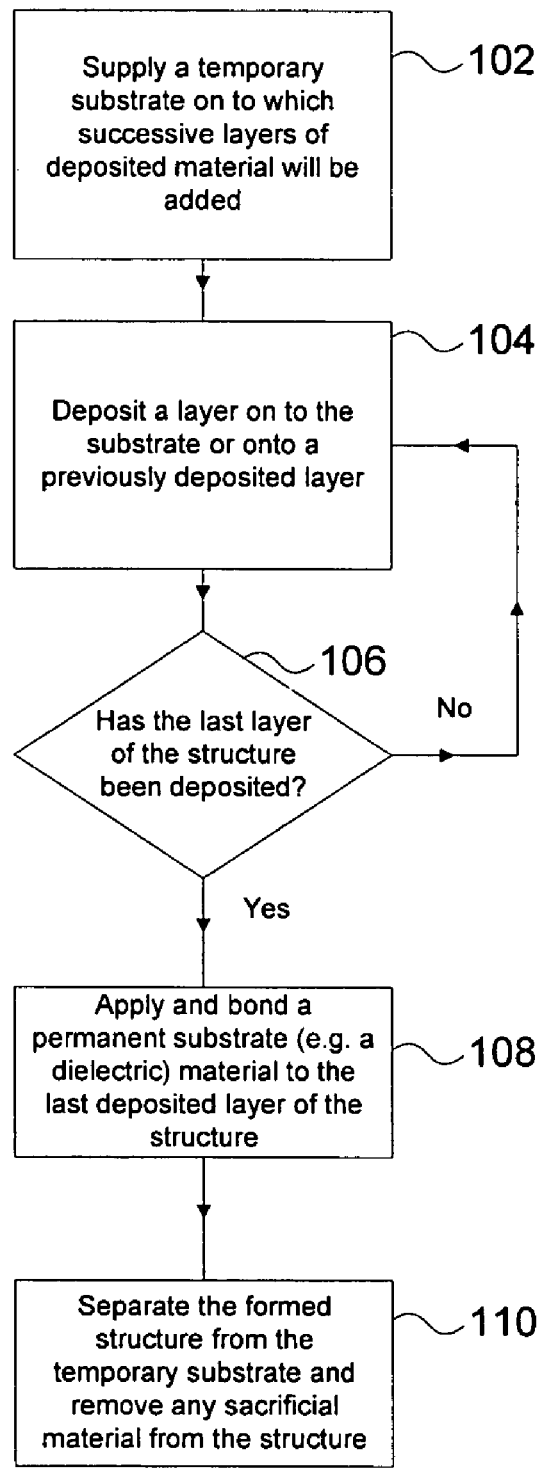
FIG. 5 depicts a flow chart of the basic operations of a preferred embodiment of the invention.

FIG. 5 presents the basic steps of a preferred embodiment of the invention in the form of a flowchart. The process starts with operation 102 which calls for a substrate onto which successive layers of deposited material will be added. This substrate is typically made from a conductive material onto which electrodeposition can occur.

The process continues with operation 104 which calls for the deposition of a layer onto the substrate or onto a previously formed layer that is already on the substrate. The deposited layer, according to certain embodiments of the invention, will contain two or more materials one or more of which are patterned to have a desired configuration for the structure being formed and the other one or more materials acting as sacrificial material which will be removed from the structure after layer formation is completed. As preferred embodiments of the invention call for the separation of the structure from the substrate on which it was formed (i.e. the temporary substrate), and as it may be desirable for the substrate to be made from a structural material as opposed to a sacrificial material, in certain embodiments, the first one or more layers deposited on the substrate may be formed solely of sacrificial material.

Furthermore, in preferred embodiments of the present invention, as the substrate on which the structure is formed is not the permanent substrate on which the structure will be attached, it is preferred in some embodiments for the first deposited layers of the structure to be the last layers of the structure relative to the permanent substrate and the last layers deposited to be the first layers relative to the permanent substrate. In other words, in some embodiments it is desirable for the structure's layers to be deposited in reverse order.

The fabrication process used may be similar to the one illustrated in FIGS. 1A–1C and 2A–2F or it may be another process set forth in the '630 patent, a process set forth in one of the other previously incorporated publications, a process described in one of the applications that is included in the listing of incorporated patents and applications set forth hereafter, or the process may be a combination of various approaches described in these publications, patents, and applications, or otherwise known or ascertainable by those of skill in the art. Of course portions of the structures may be formed by any other three-dimensional modeling process.

After deposition of a layer, the process proceeds to operation 106, in which an inquiry is made as to whether the last layer of the structure has been formed (i.e. the layer that will contact the permanent substrate in certain embodiments of the invention). If the answer is "no", the process loops back to operation 104 for one or more further depositions. If the answer is "yes", the process moves forward to operation 108.

Operation 108 calls for the attachment of a permanent substrate (e.g. a dielectric material) to the last deposited layer of the structure. The attachment may occur via an adhesive (e.g. a pressure sensitive adhesive, a heat sensitive adhesive, or a radiation curable adhesive (if the substrate is transparent to the appropriate radiation). The application of the adhesive may occur in various ways known to those of skill in the art (e.g. spreading, spinning, spraying, and the like). Attachment may alternatively occur via non-adhesive based bonding techniques, e.g. surface melting, sintering, brazing, ultrasonic welding, vibration welding, and the like.

After attaching the permanent substrate and the layers of deposited material together, the process proceeds to operation 110 where permanent structure and layers are separated from the temporary substrate and any sacrificial material is removed. The separation process may occur as a natural part of the sacrificial material removal process if one or more layers of sacrificial material are interposed between the temporary substrate and the structural material or if the temporary substrate is made of the sacrificial material or other material that is attacked by an etchant being used to selectively separate the sacrificial and structural materials.

In alternative embodiments, the three tasks set forth in operations 108 and 110 may be performed in varying orders, for example: (1) bonding and then simultaneous separation and removal, (2) bonding, separation, then removal, (3) simultaneous separation and removal then bonding, (4) removal, bonding, then separation.

Figure 6A:
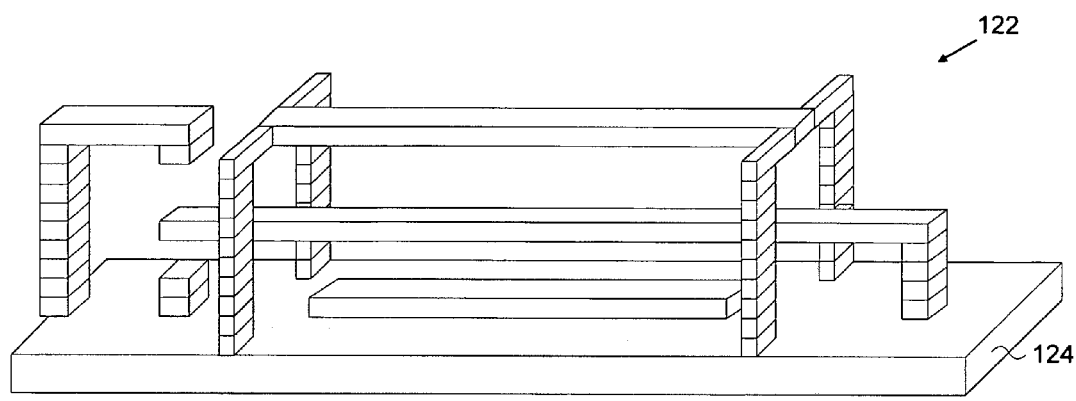
FIGS. 6A–6C depict an example of a structure created according to a preferred embodiment of the invention where
Figure 6B:
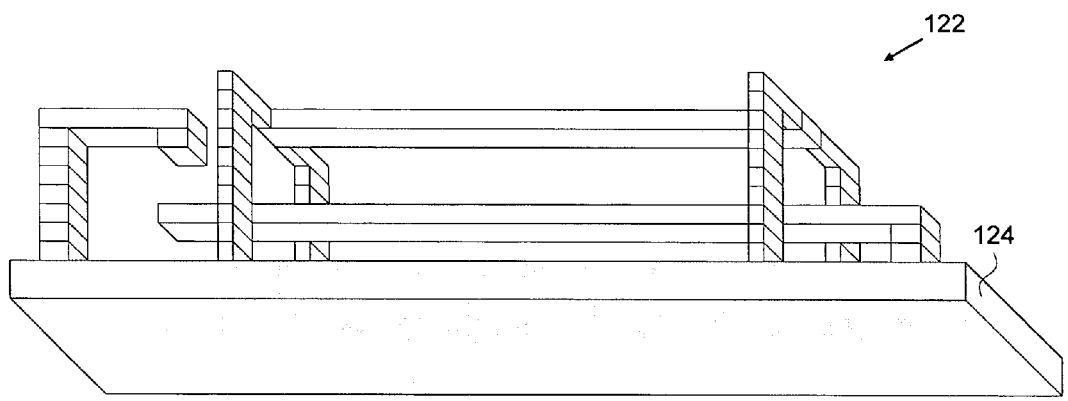
Figure 6C:
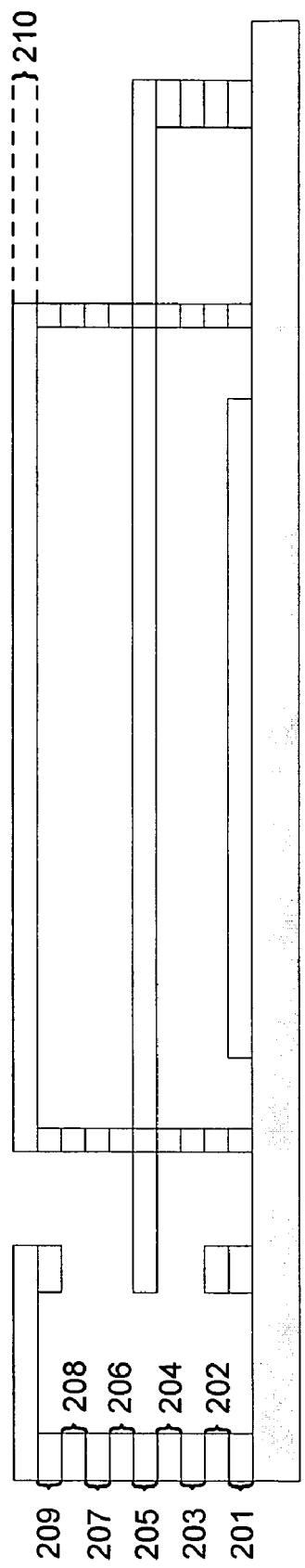
Figure 7A:
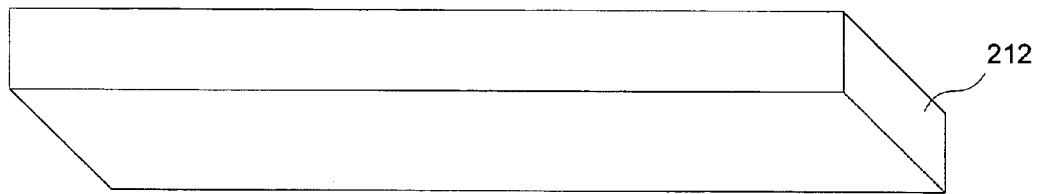
FIGS. 7A–7O illustrate the production of the structure of FIGS. 6A–6C from a plurality of adhered layers according to a preferred embodiment of the invention.

FIGS. 6A–6C depict an example of a structure (e.g. a switch) created according to a preferred embodiment of the invention. Two different perspective views of the structure are shown and a side view is shown. The view seen in FIG. 6A allows the structure 122 to be seen in its entirety while the structure is attached to permanent substrate 124. The view seen in FIG. 6B obscures a portion of structure 122 when it is attached to permanent substrate 124 but allows the layer formation process to be seen when the structure is being formed and attached to the temporary substrate as shown in FIGS. 7A–7N. As can be seen in FIG. 6C the structure consists of ten layers numbered 201–210.

FIGS. 7A–7N illustrates the formation of the structure of FIGS. 6A–6C. In this embodiment, successive layers are formed and adhered to the bottom of previously deposited layers. With the exception of the sacrificial material shown in FIG. 7B, when showing structural material and sacrificial material on the current deposition layer, the structural material is fully illustrated while only an outline of the sacrificial material is shown. On a current deposition layer any order of depositing structural material and sacrificial material is acceptable. In alternative embodiments, the layers may be deposited one on top of the other or one beside the other. In this application, unless a different interpretation is required by the context, when a deposition is said to occur onto a previous deposition, no absolute inference of layer orientation should be made but only a relative orientation of deposition order should be inferred.

FIG. 7A illustrates that the process starts with a temporary substrate 212.

Figure 7B:
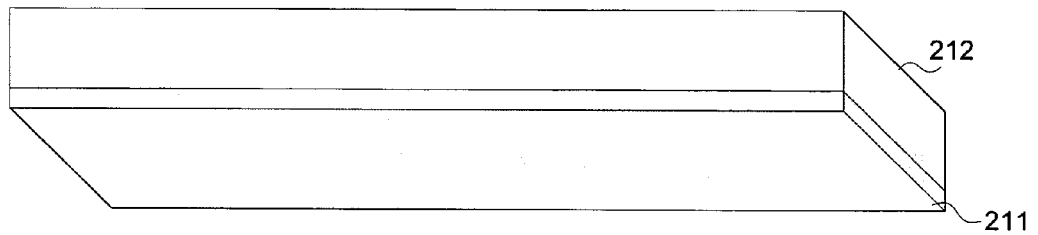

FIG. 7B indicates that the temporary substrate is supplied with a coating or first deposited layer 211 of sacrificial material. This layer 211 of sacrificial material will allow separation of the structural material from the temporary substrate during a later step of the formation process. Of course in actual practice, more than one such layer 211 may be formed or its thickness may be tailored to allow easy separation during a later step.

Figure 7C:
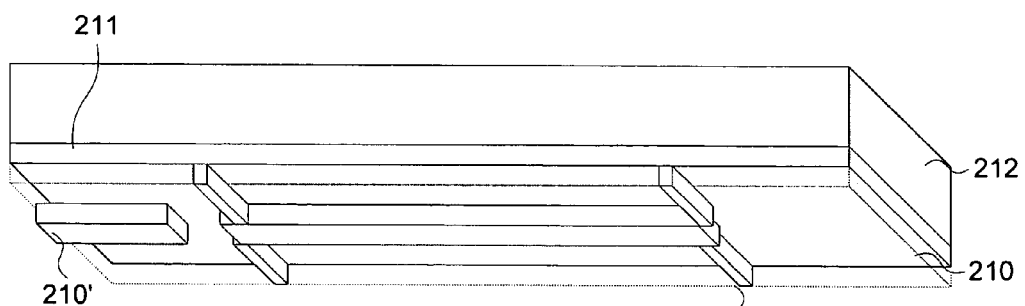
Figure 7I:
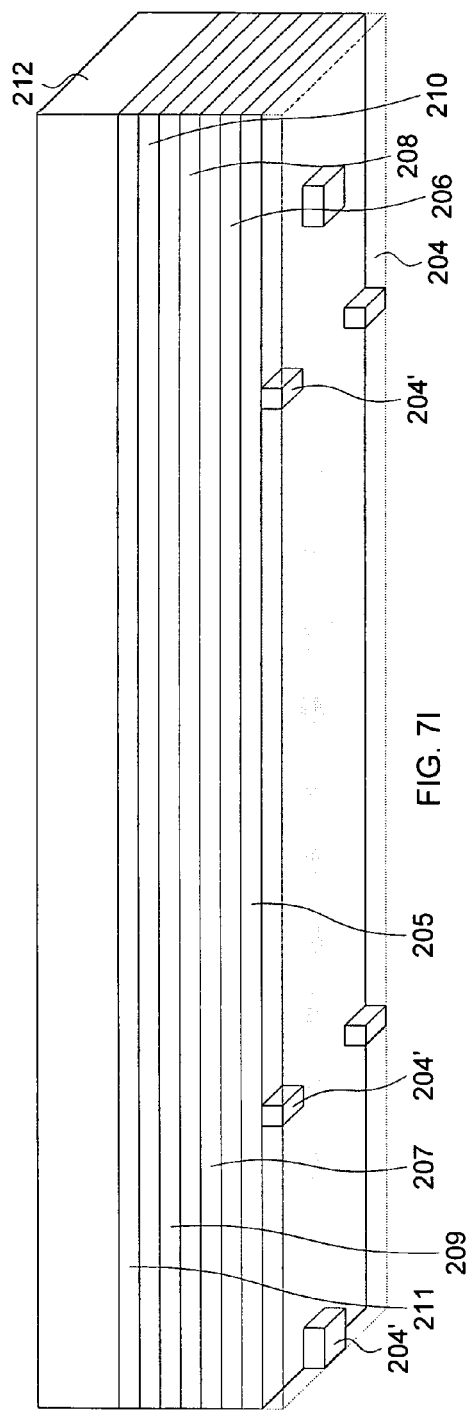
Figure 7J:
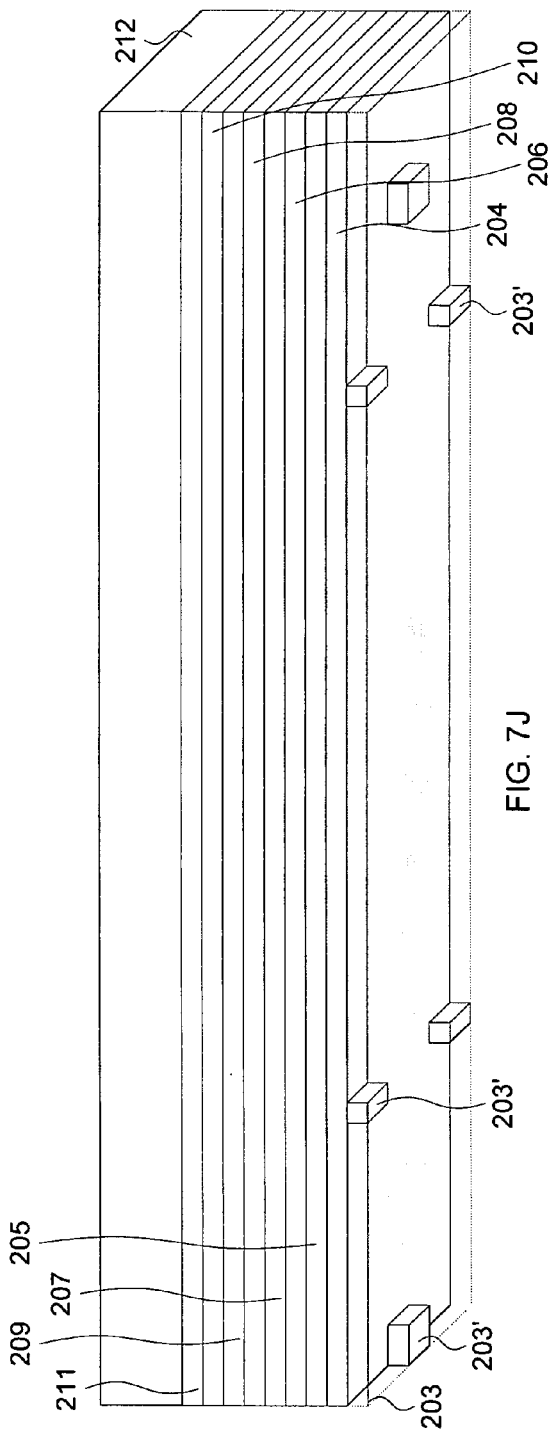

FIG. 7C shows the structural material 210' of layer 210 that is patterned along with an outline indicating the boundary of the sacrificial material that is also present.

FIGS. 7D–7L increment through successive deposition layers ranging from layer 209 down to 201. The pattern of structural material 209' to 201' for each of the successive deposition layers is also shown along with an outline of the sacrificial material associated with the current layer. Previously deposited layers are shown as solid blocks of material without distinction between the patterning of the structural and sacrificial materials.

Figure 7M:
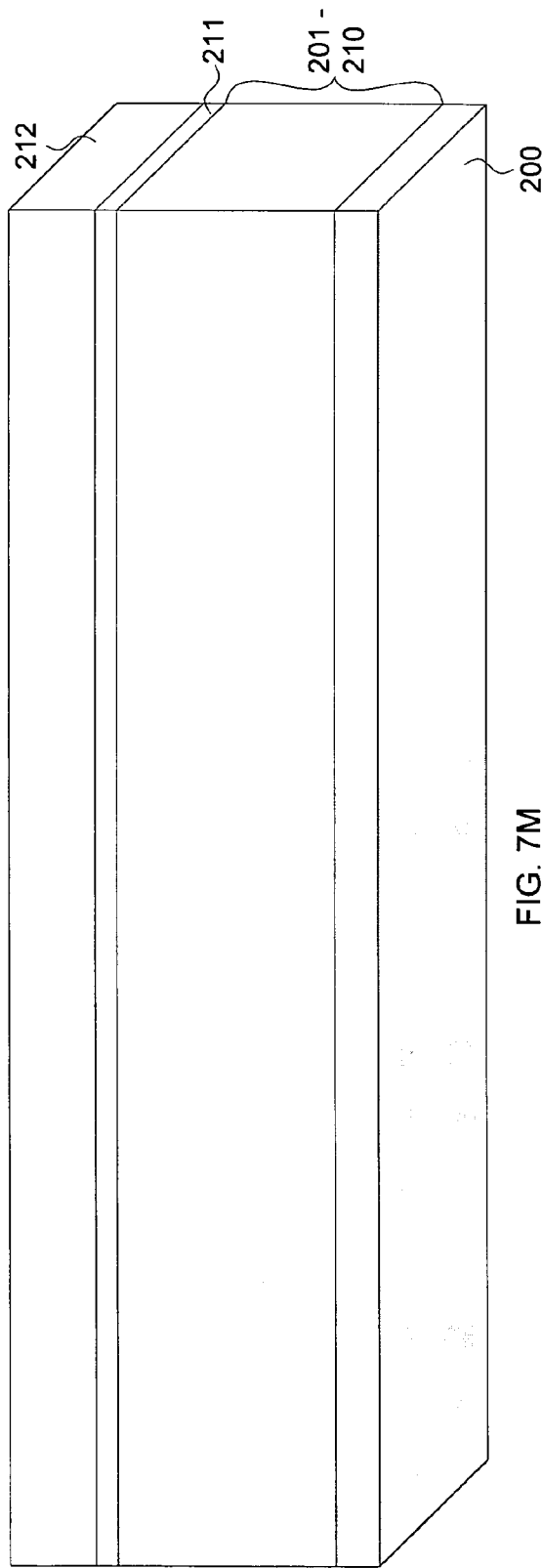

FIG. 7M depicts a block of materials including the permanent substrate 200 attached to (1) the stack of layers 201–210, (2) the release layer 211, and (3) the temporary substrate 212.

FIG. 7N depicts a the same view at shown FIG. 7M with the exception that the permanent substrate 200 and sacrificial material are shown as being transparent so that the patterns of structural material for each layer may be seen.

Figure 7O:
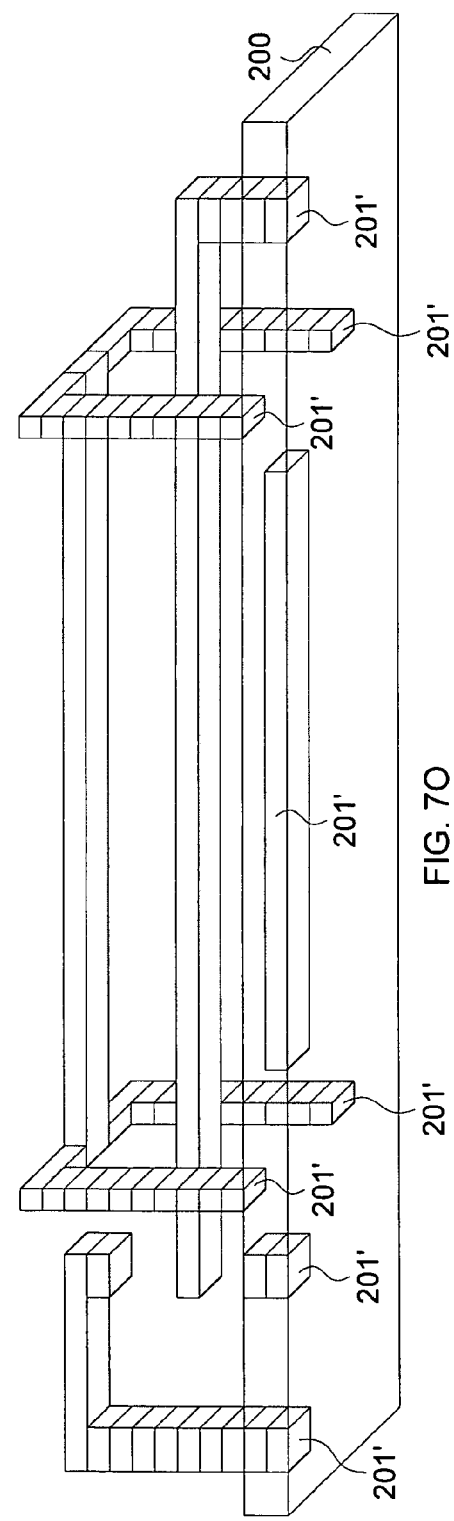
Figure 7N:
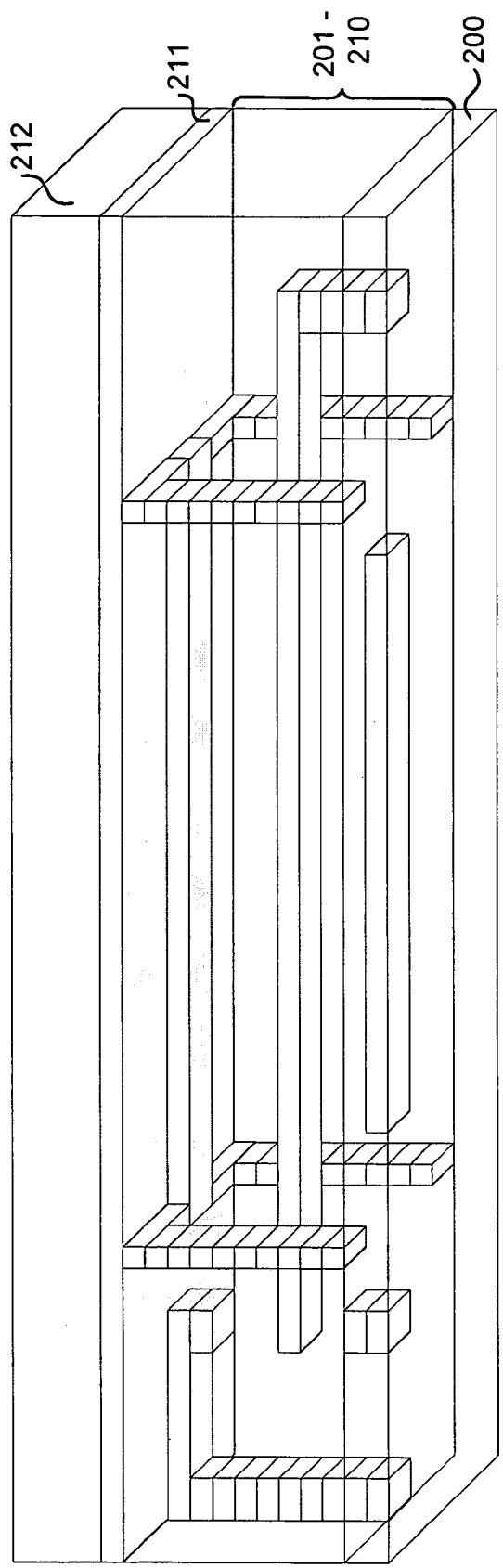

FIG. 7O depicts the released structural material adhered to the permanent substrate 200. The substrate is shown as transparent for illustrative purposes but which may be opaque or transparent (e.g. glass) in applications that may require or benefit from such a material (e.g. when the structure includes a scanning mirror that is to receive radiation through the substrate and is to transmit it back out through the substrate). The temporary substrate may be removed along with the sacrificial material which may be removed by selective etching with an etchant (e.g. Enstrip C-38) that is selective to the sacrificial material (e.g. copper) but non-destructive to the structural material (e.g. nickel).

Figure 8C:
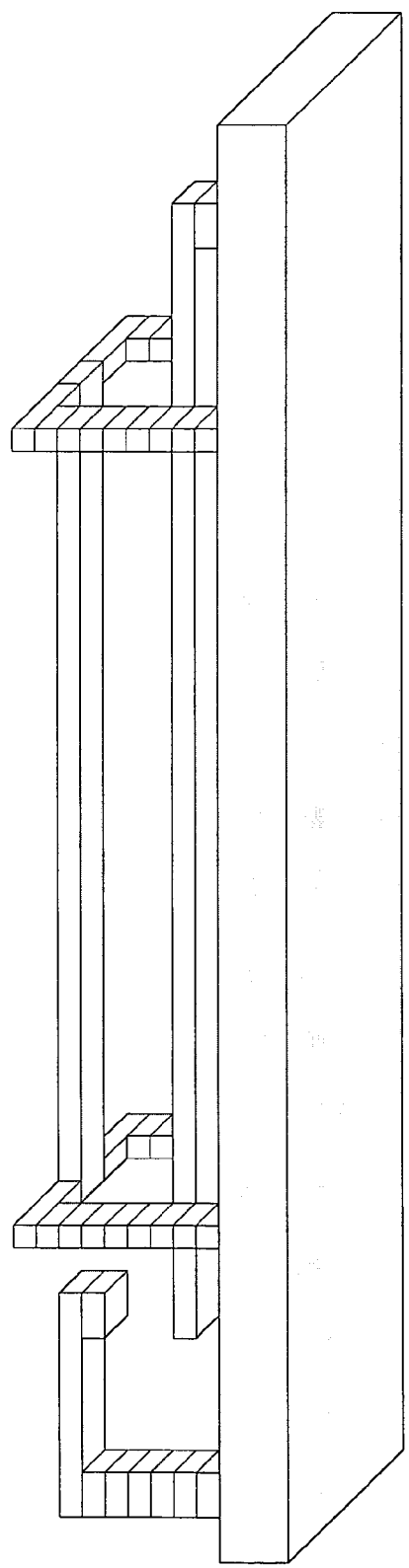
Figure 8D:
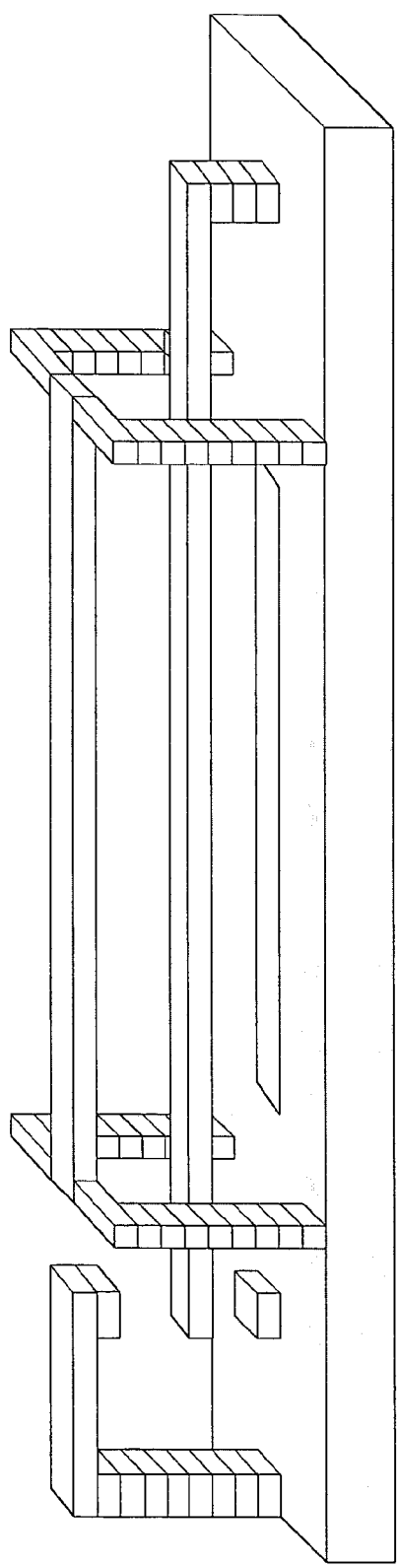

FIGS. 8A–8D illustrate a variation to the formation of the last layer of the structure of FIGS. 6A–6C and a variation in how the permanent substrate mates with that layer. FIG. 8A shows the final layer including only the structural material 201'. FIG. 8B depicts the permanent substrate being formed or adhered to not only the bottom of the last layer but also to the sides of the last layer such that the structural material of the last layer becomes at least partially embedded in the substrate. FIGS. 8C and 8D depict two perspective views of the resulting structure. As can be seen structural material 201' is embedded in the substrate and only nine of the ten original layers of structural material extend above the surface of the substrate. The surrounding of the structural material 201' by the substrate may be achieved in various ways. For example, instead of the substrate being in the form of a performed sheet that is bonded to the layers, it may be in the form of a flowable material that can be molded to partially embed the structural material and to have a desired thickness extending beyond the surface of the last layer of structural material. As another example, the substrate may still be in the form of a sheet that is bonded to the structural material 201' of the last layer but a portion of the last layer where the sacrificial material has been removed or never deposited may be filled with an epoxy or other flowable/solidifiable material. The permanent substrate may be placed in position and the hardening of the epoxy or other material may not only fill the region around structural material 201' but also cause bonding between the layers and the substrate.

Various alternatives to the above embodiments exist. Even when not molding the substrate around the sides of at least one layer, it is still possible to use a moldable material and form the substrate from a temporarily flowable material as opposed to a sheet of material. Contact pads and runners may be formed of the structural material and these may extend to desired locations on the surface of the substrate or may even be encapsulated by the substrate material except at desired contact points. A selective partial etching of the sacrificial material may occur before attachment or formation of the permanent substrate. Layers of material may be etched to a depth of less than one layer thickness or more than one layer thickness. In some embodiments the depth of etching may be such that portions of the structural material may extend completely through the substrate that will be molded so as to form interconnects that protrude from the bottom of the substrate. In embodiments where it is desired to have interconnects extend through the bottom of the substrate, and when such extension does not occur during molding, the back side of the substrate may be planarized until the structural material is exposed. Substrates need not be planar and their lateral extents need not correspond to those of the layers.

If partially etching the sacrificial material to a depth of more that one layer thickness, it is preferred that the pattern of structural material remain fixed for all but maybe the highest layer that will be exposed by the partial etching. This will help ensure a more uniform depth of etching. However, in embodiments where the depth of etching is less critical or it is determined that a varying structural pattern will yield a desired etching pattern, no such restriction on structural material patterning need exist.

In some embodiments instead of the temporary substrate and permanent substrate being mounted on opposite sides of the deposited layers, the permanent substrate may be mounted in an orientation perpendicular to that of the temporary substrate. In other words, the permanent substrate may be mounted to the sides of a plurality of deposited layers.

In some embodiments, instead of attaching the permanent substrate to the opposite side of the stack of layers relative to the temporary substrate, the temporary substrate may be removed and the permanent substrate bonded in its place. This may occur by having the temporary substrate or its upper most surface formed of a material that can be selectively etched or otherwise removed from the layers of material preferably without damaging either the structural material or sacrificial material of those layers. And after removal, the bottom most layer of the structure would be exposed and the permanent substrate (e.g. dielectric substrate) attached thereto.

When desiring to mount the permanent substrate into the same position occupied by the temporary substrate, in some embodiments it may be desirable to first mount a second temporary substrate on the opposite side of the stack as compared to the first temporary substrate after which the first temporary substrate may be removed, followed by attachment of the permanent substrate, and then followed by the removal of the second temporary substrate.

In still other embodiments, the permanent substrate can be mounted on the opposite side of the stack of layers as compared to the substrate on which the layers were formed and the substrate on which the layers were formed can remain.

In some embodiments of the invention, the permanent substrate may not be a dielectric but instead may be of some other material. For example, the permanent substrate might be made of a conductive material that cannot be readily electrodeposited.

Though the use of the term "permanent substrate" has been used herein, it should be understood that it is not intended that the permanent substrate must exist throughout the life of the structure but instead that if form part of the structure for at least some portion of its useful life.

In some embodiments of the invention, a sacrificial material may not be used when depositing the layers one upon the other. In some embodiments, formation of layers may be by single or multiple selective depositions and potentially one or more blanket depositions and potentially one or more planarization operations.

Some embodiments of the invention may provide for attachment of electrochemically produced structures (e.g. structures formed using conformable contact masking techniques) to substrates that may include active elements. This is illustrated in the following example where an electrochemically fabricated structure is attached to a piezoelectric element and the combination of the two provides a working piezoelectric device.

Figures 9A, 9B, 9C, 9D, 9E:
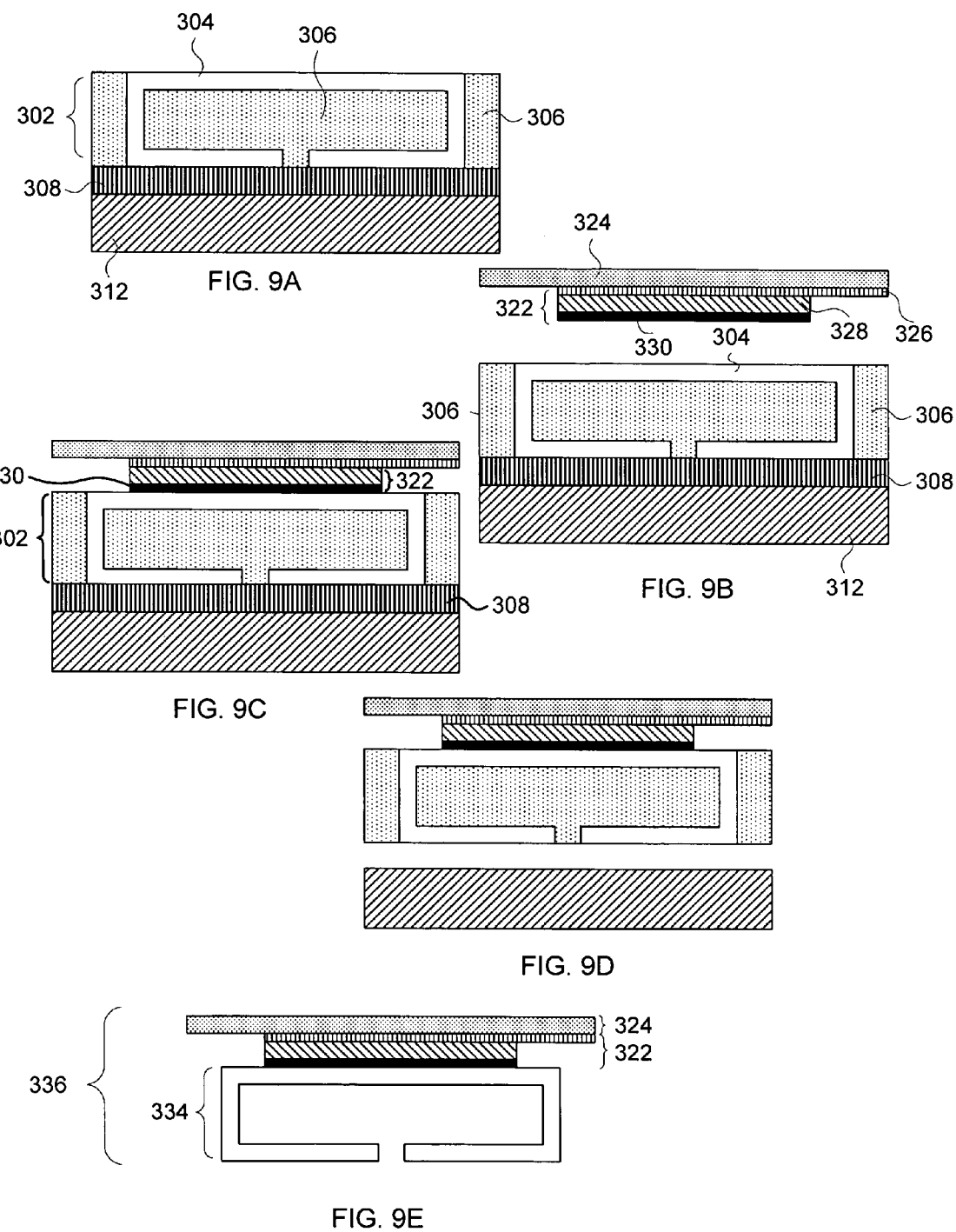
FIGS. 9A–9E depict the results of various steps during the practice of an embodiment of the invention.

In FIG. 9A a structure 302 includes structural material 304 surrounded by a sacrificial material 306. The structure 302 is preferably fabricated via electrochemical fabrication from a plurality of adhered layers. The structure 302 is fabricated on a release material 308 which in turn is attached to a substrate 312. The release material 308 may be the same as the sacrificial material 306 or alternatively it may be another material that can be separated by etching or melting (e.g., a solder) or otherwise removed. The release material 308 may have been coated onto a substrate 312 prior to the start of electrochemical fabrication of the structure 302 or may be formed as a result of one or more initial depositions of the electrochemical process. The substrate is typically a conductive material.

In FIG. 9B, a pre-fabricated element or component 322 is shown located above the structure 302. The pre-fabricated element or component 322 has been prepared for attachment to the electrochemically fabricated structure 302. The element or component 322 is attached to a device substrate 324. Typically, the device substrate 324 will serve as the final substrate for the device which will be a combination of element or component 322 and the structural material of structure 302. Depending the final requirement of a particular device the device substrate may take on any desired properties (e.g. be a conductor, a dielectric, a transparent material, a flexible material, or the like). In the present example, the device substrate 324 is a dielectric so that if may provide electrical isolation). On the device substrate a metal element 326 is patterned on to which a region of piezoelectric material 328 is patterned and on to which an adhesive 330 (which may be electrically conductive if desired) is patterned. An appropriate adhesive is one which provides good adhesion to the structural material 304 of the structure 302. The metal element 326 is provided and patterned to serve as an electrode to actuate the piezoelectric material and as a trace that interconnects the electrode to a power supply.

In FIG. 9C, the pre-fabricated element or component 322 is shown as being adhered to structure 302 by means of the adhesive 330. In FIG. 9D, the release material 308 is shown as having been removed. Finally, in FIG. 9E, the sacrificial material 306 has been removed from structural material 304 to release component 334 from structure 302 thereby yielding the completed device 336 which is a combination of component 334, component 322, and device substrate 324.

Figure 10:
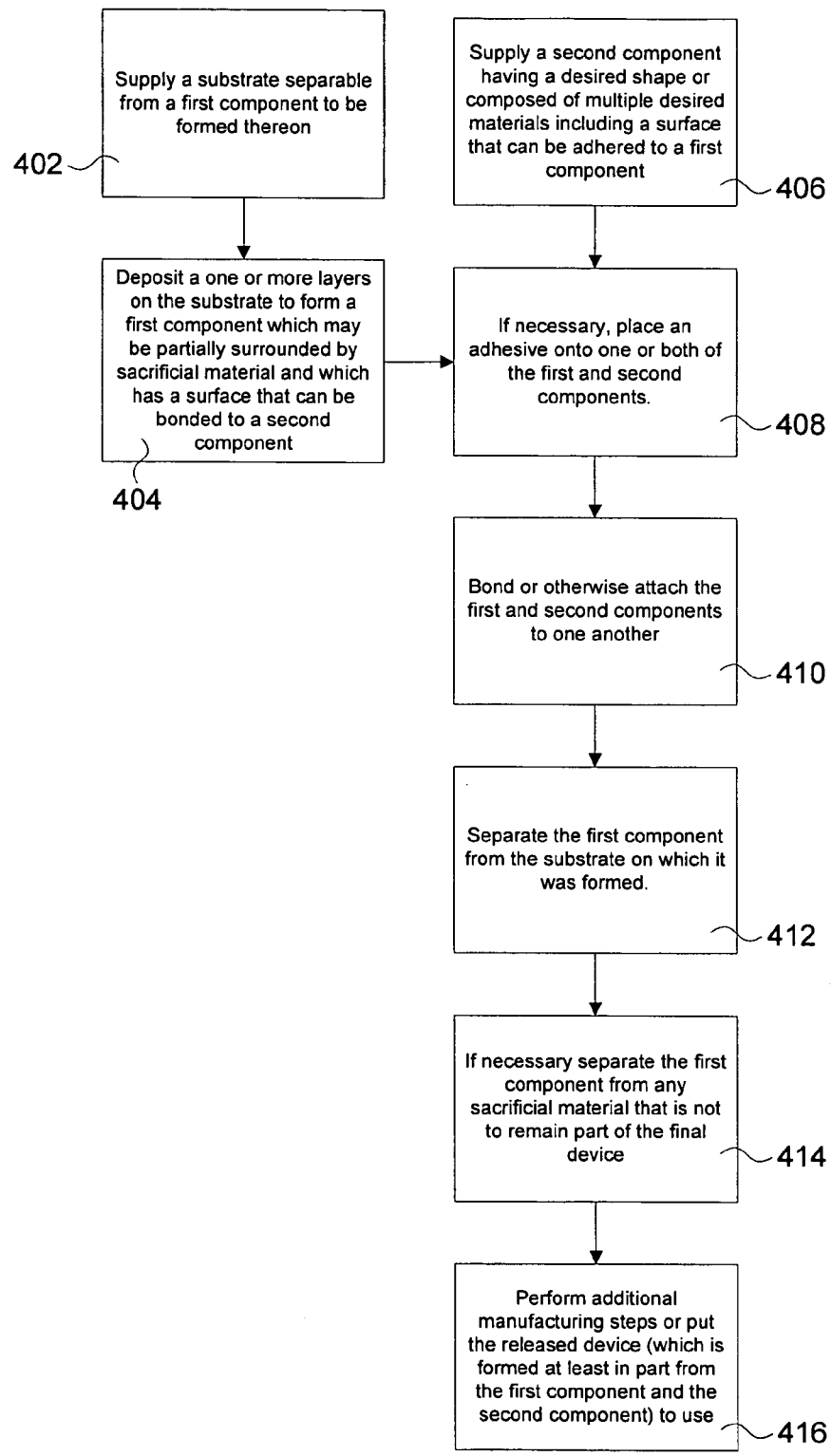
FIG. 10 provides a flowchart illustrating various steps of an embodiment of the invention.

FIG. 10 provides a flowchart illustrating the process flow associated with the embodiment of FIGS. 9A–9E. In FIG. 10, the process begins at two points as illustrated by steps 402 and 406. Step 402 calls for the supplying of a substrate that is separable from a component that will be formed thereon. The substrate and component might, for example, be separable as a result of the substrate having a release layer thereon or they might be separable as a result of a release layer that will be formed on the substrate.

Step 406 calls for the supplying of a second component, where the second component will have a desired shape or will be composed of multiple desired materials. The second component will have a surface that can be attached to the surface of the first component which will be formed on the substrate of step 402.

Step 404 calls for the formation of one or more layers on the substrate supply in step 402 so as to form a first component (i.e. portion) of a device that is to be created. In the process of forming the first component, the component may be partially surrounded by a sacrificial material which will be eventually removed from the component portion of the layers that are formed. The first component will have a surface that is capable of being bonded or otherwise attached to the second component. Both the steps 404 and 406 are the starting points for step 408.

In step 408 either one or both of the first and second components are prepared for adhesion to the other component by the addition of an adhesive to at least one of the bonding surfaces. Of course, in alternative embodiments step 408 may not be part of the process. In some embodiments an adhesive may be part of the second component that is supplied.

From step 408 the process moves forward to step 410 where the two components are bonded or otherwise attached to one another. This attachment may occur by use of a pressure sensitive adhesive, a hot melt adhesive, or by other means known to those of skill in the art.

The process then moves forward to step 412 where the first component is separated from the substrate on which it was formed.

Then the process moves forward to step 414 where the first component is separated from any sacrificial material that is not to remain part of the final device that is being created.

Next the process moves to step 416 where either additional manufacturing steps may be performed or where the device that was released in step 414 may be put to use.

In alternative embodiments, the order of steps 414 and 412 may be reversed. In still other embodiments the accomplishment of steps 414 and 412 may occur simultaneously. In still further alternative embodiments either one of steps 412 or 414 or both of them may occur between steps 408 and 410. Various other alternatives will be apparent to those of skill of the art upon review of the teachings herein.

In some embodiments of the invention the attached substrate may be a passive device but the structure that is attached to it may include structures having electrochemically fabricated portions and portions fabricated by other deposition and patterning techniques. One or both the portions may include active components. This is illustrated in the following embodiment.

FIG. 11 provides an example of another alternative embodiment where the process includes a combination of conformable contact mask deposition operations and other deposition and patterning operations. FIG. 11A depicts a side view of a first structure 502 which for illustrative purposes is identical to that of FIG. 9A.

Figure 11A:
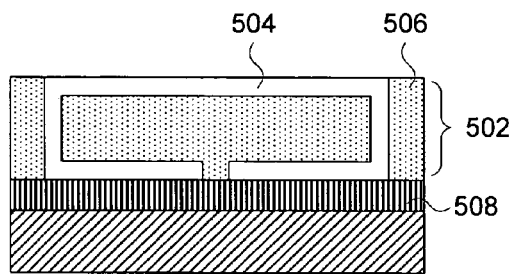
FIGS. 11A–11J depict the results of various steps during the practice of an embodiment of the invention.
Figure 11B:
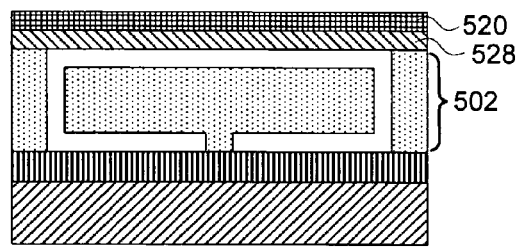

In FIG. 11B, a piezoelectric material 528 has been deposited onto the top surface (i.e., last layer) of structure 502, and a photoresist 520 has been deposited on to the piezoelectric material 528.

Figure 11C:
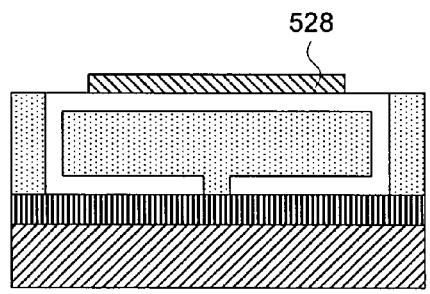

In FIG. 11C, a desired pattern of piezoelectric material 528 is shown. The patterning of this piezoelectric material may occur by first patterning the photoresist 520 which is then used as a pattern for selectively etching the piezoelectric material. In an alternative process, for example, the piezoelectric material may have been patterned by lift-off methods or the like.

Figure 11D:
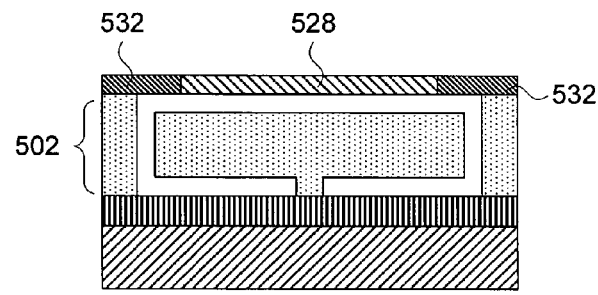

FIG. 11D illustrates an optional step for bringing the surface level of the partially formed device to a uniform height by using a dielectric material 532 to fill the voids that resulted from the etching of the piezoelectric material. In some alternative embodiments, it may be necessary, or at least desirable, to planarize the combined dielectric and piezoelectric material layer.

Figure 11E:
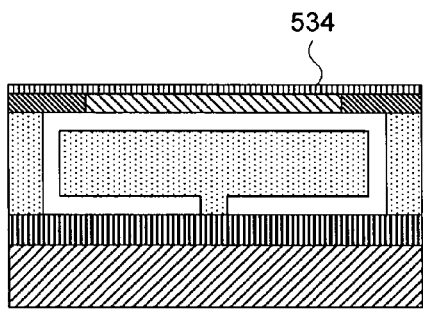

FIG. 11E, depicts the resulting structure after deposition of a next layer that supplies a metal 534 on top of the piezoelectric and dielectric materials.

Figure 11F:
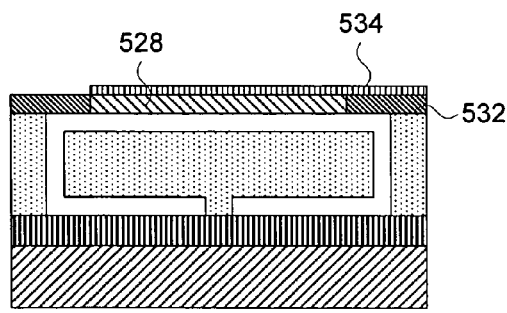
Figure 11G:
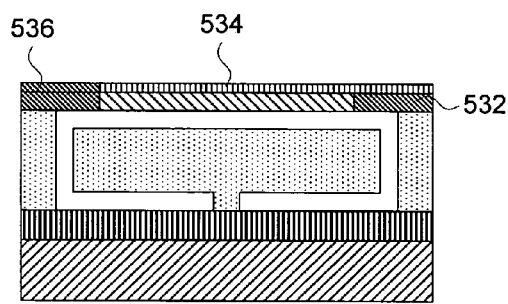
Figure 11H:
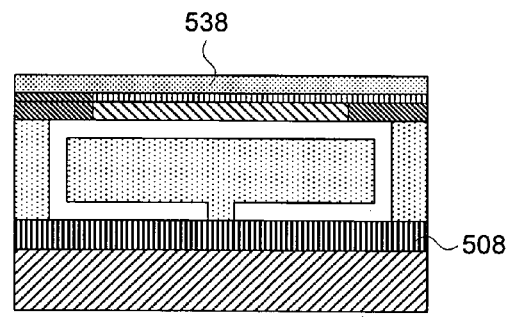
Figure 11I:
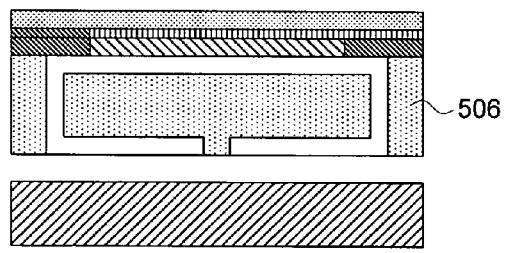
Figure 11J:
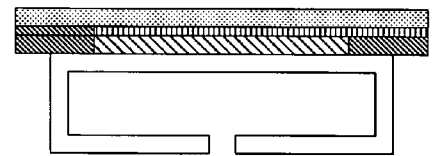

FIG. 11F, illustrates the result of an operation that patterns the deposited metal. The pattern of the metal is selected to form an electrode for the piezoelectric element as well as an interconnect trace. The patterning of the metal may occur in a variety of ways, for example in one of the ways noted above for patterning the piezoelectric material. FIG. 11G illustrates the result of an operation that fills the voids in the metal layer with a dielectric material 536 which may be the same as dielectric 532. The filling of the voids may be carried out in a manner similar to that used for filling the voids in the piezoelectric containing layer. For example, a material may be deposited in bulk, distributed, cured, and then planarized to yield a layer of desired thickness and uniformity. In FIG. 11H, a device substrate 538 is applied over the metal/dielectric layer. The substrate may have any desired properties and in the present example it is a dielectric. In FIG. 11I, a release material 508 is shown as having been removed. Finally, in FIG. 11J, a sacrificial material 506 is shown as having been removed so as to yield a released device that may undergo additional processing operations or be put to use.

In a final device, an electric connection through the structural material 304 or 504 may be used to provide a second electrode for the piezoelectric element in order to produce a functional device.

Figure 12:
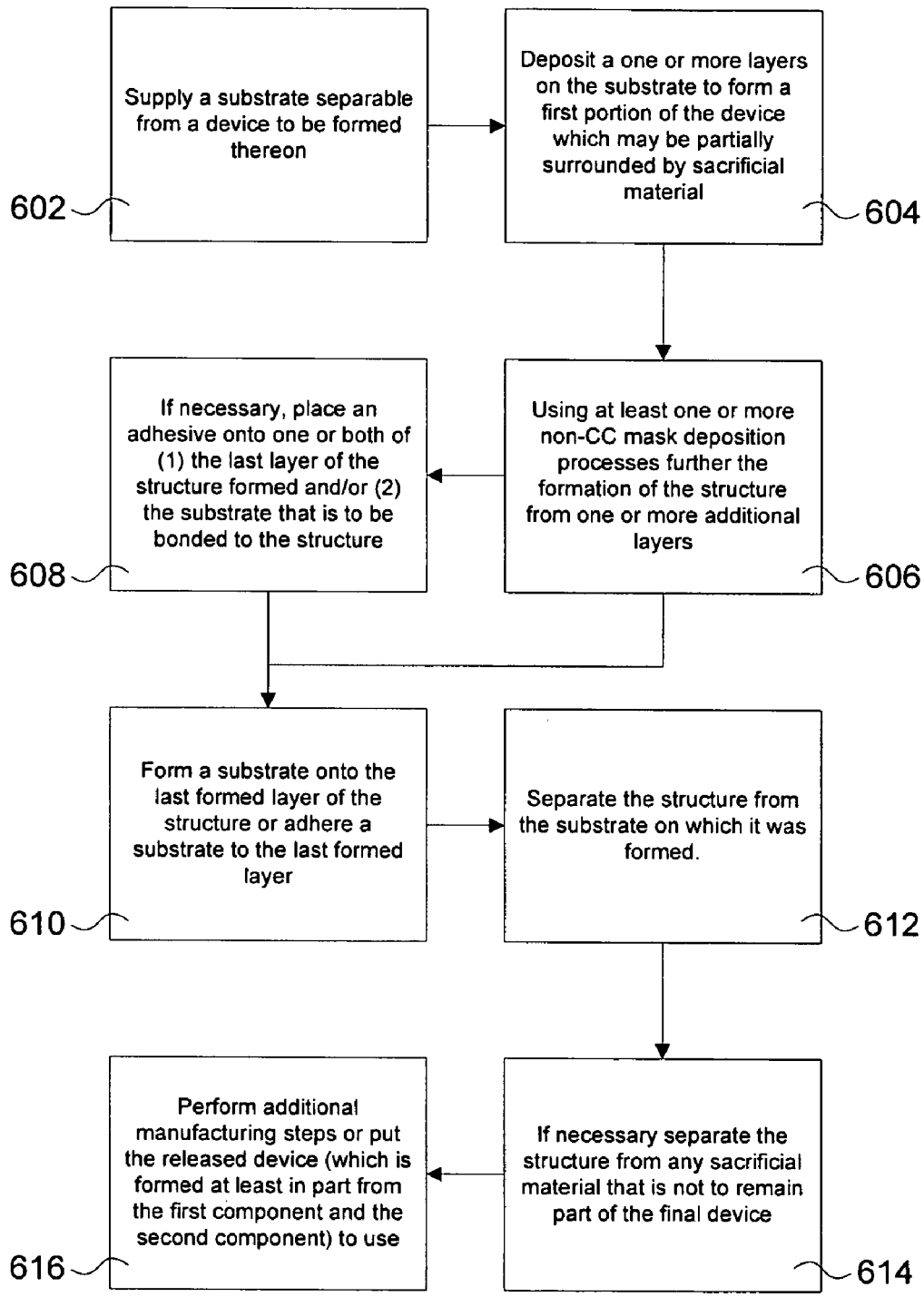
FIG. 12 provides a flowchart illustrating various steps of an embodiment of the invention.

FIG. 12 provides a flow chart illustrating the process exemplified in FIGS. 11A–11J. The process starts with step 602 where a substrate is supplied onto which a device is to be formed. Also as the device will be eventually transferred to a different substrate the substrate should either have the release layer already in place or alternatively an appropriate release material (e.g. sacrificial material) may be added during the first one or more layers of electrochemical fabrication.

Step 604 calls for the formation of one or more layers (e.g. by electrochemical fabrication) which will form a portion of the device which may be surrounded by a sacrificial material.

Step 606 calls for the use of at least one or more non-conformable contact mask deposition processes to build up and pattern the structure. In some embodiments additional electrochemical fabrication operations may be used in completing formation of the structure which will include the unreleased device.

Step 608 optionally calls for the placement of an adhesive on the last layer of the formed structure and/or on a substrate that is going to be bonded to the structure. The use of such adhesive may or may not be necessary depending on the material that the substrate is made from and the process or processes that will be used to cause joining.

Step 610 follows step 606 or step 608 and calls for the formation of the substrate on the last formed layer of the structure or the adherence on the substrate on the last formed layer.

Step 612 calls for the separation of the structure from the original substrate on which it was formed.

Step 614 calls for the separation of the structure from any sacrificial material that is not to remain part of the final device. This separation will result in a release of the device.

Step 616 calls for the performance of any additional manufacturing steps or the putting of the device into use. As with the flowchart of FIG. 10, various alternative steps may be performed as well as various reorderings of the exemplified steps.

Examples of two additional embodiments are depicted in FIGS. 13A–13E, 14A–14C, and 15A–15F. These two embodiments depict substrate swapping techniques that include either enhanced surface area (interlacing) between the structure and the adhered substrate or the formation of features in the structure that allow interlocking with the swapped substrate.

Figure 13A:
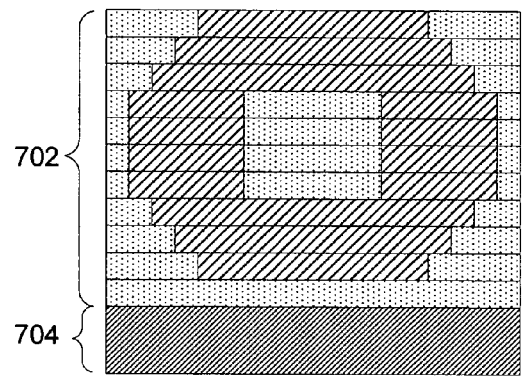
FIGS. 13A–13C schematically depict a process for swapping a structure 702 from a first substrate 704 to a second substrate 706.
Figure 13B:
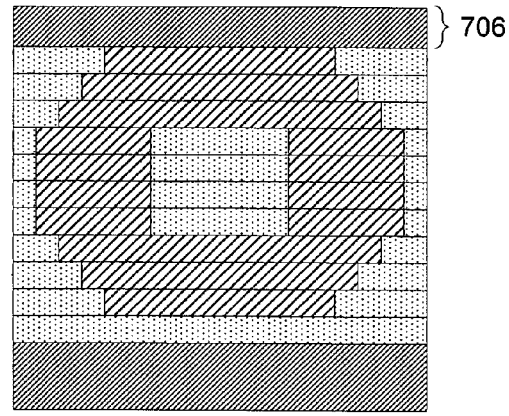
Figure 13C:
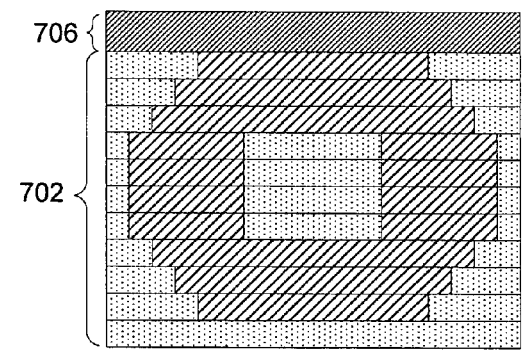

FIGS. 13A–13C schematically exemplify a process for swapping a structure 702 from a first substrate 704 to a second substrate 706 where the contact area between the structure and the second substrate is substantially planar and thus no enhanced surface area or interlocking regions exist to aid in improving adhesion.

Figure 13D:
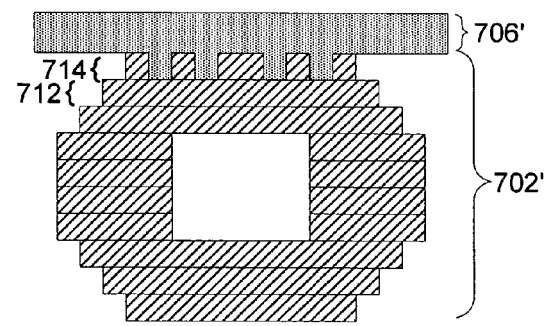
FIGS. 13D and 13E schematically depict side views of structures and substrates having modified configurations for enhancing attachment.

FIG. 13D depicts a modified structure 702' and modified substrate 706' where notches exist in what was a planar surface of the structure and where protrusions in either the swapped substrate or in an adhesive enter the notches and enhance adhesion between the structure and substrate.

Figure 13E:
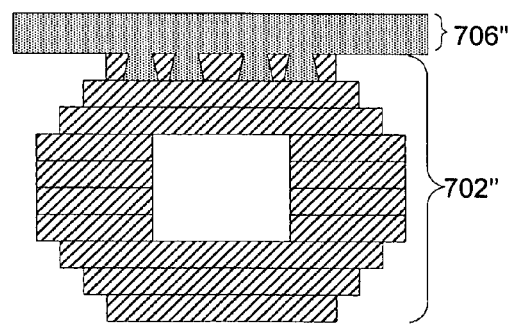

FIG. 13E depicts a modified structure 702'' adhered to a modified swapped substrate 706'' where the structure 702'' includes notches with undercuts in which material from the swapped substrate or an adhesive becomes located such that adhesion between the structure and substrate is enhanced by mechanical interlocking between them.

The modified structure 702' of FIG. 13D can be implemented in a number of different manners. One implementation is depicted in FIGS. 14A–14C.

Figure 14A:
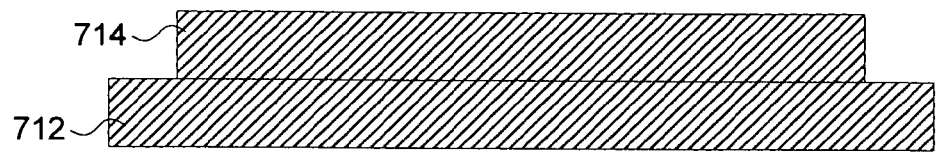
FIGS. 14A–14C schematically depict a process for modifying a configuration of an attachment layer so that it includes notches as indicated in FIG. 13D.

FIG. 14A depicts the final two layers 712 and 714 of the structure 702'' of FIG. 13D as they would have been produced if no interlocking were to occur upon attachment of layer 714 to a substrate.

Figure 14B:
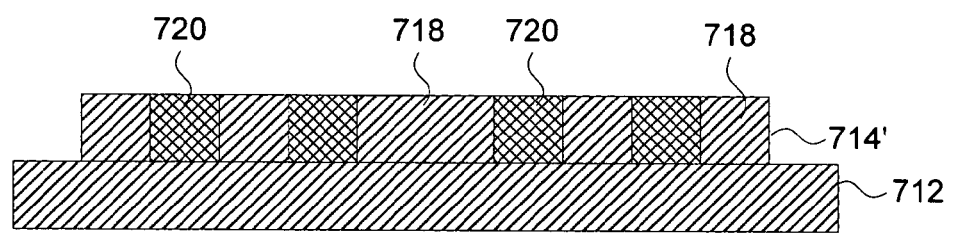

FIG. 14B depicts a modified version 714' of layer 714, where layer 714' is modified to include holes, notches, slots, or the like in the structural material 718. These holes and notches may be filled with a sacrificial material 720 as part of the layer formation process.

Figure 14C:
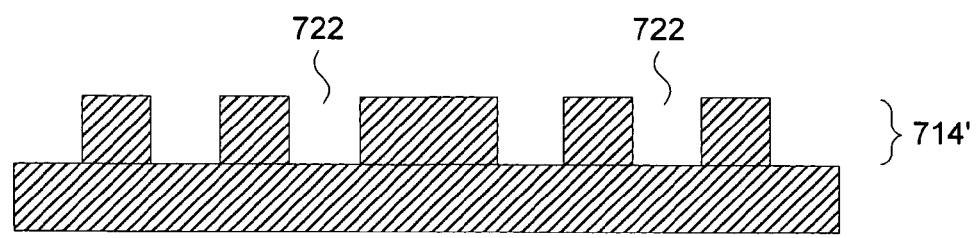

FIG. 14C depicts the state of the process after the sacrificial material 720 shown in FIG. 14B is removed from the openings 722 in layer 714'.

In some embodiments, the openings in layer 714' may have occurred during the layer formation process as a result of modifying the data descriptive of the layer. Alternatively, in other embodiments the holes in layer 714' may have been made after layer formation was completed by selectively etching holes into a layer 714 at desired locations. Such etching processes may be performed using contact masks or adhered masks. The etching out of sacrificial material 720 on the other hand may occur in bulk if one is not concerned about removing sacrificial material from other regions of the structure. Alternatively the etching may occur by use of one or more masks that at least shield regions of sacrificial material that are not to be removed, or that also shield the structural material. After the openings are etched into the layer, an adhesive or flowable substrate material may be applied and the substrate bonded to the structure or solidified in contact with the structure (which results in bonding).

In some embodiments, it is preferable that the sacrificial material located in regions outside the structural material portions of layer 714 not be etched away prior to occurrence of the bonding operation. Such ordering of bonding and removal of sacrificial material may allow for improved bonding orientation between the substrate and the structure and/or may help limit the movement of adhesive or flowable substrate material into regions surrounding the structure. In other embodiments it maybe preferable to remove the sacrificial material that is external to the structural material regions, for example, since the sacrificial material may be more accessible prior to bonding than after bonding.

In still other embodiments, external region etching may occur prior to bonding simply because the structures being bonded are relatively tolerant to non-uniformities in orientation or exact positioning and/or to the partial or complete filling of voids by flowable substrate material or adhesive. The obtainment of data associated with modifying the last layer of the structure (or even the last several layers of a structure) may be based upon a designer modifying a CAD file or by a data processing program that performs various Boolean operations (e.g. erosion or expansion operations) which may be based on a fixed or user definable set of parameters (e.g. a fixed grid of attachment points and sizes which can be overlaid against the exact position of the structural material of the layer or layers). Such data processing operations may be based on structure data that has already been transformed into layer data or it may be based on structural data that remains in a three-dimensional format.

The gripping functionality of the transition region between the structure and the substrate of FIG. 13E may be obtainable in a variety of ways. For example, an etching operation may be used that has a tendency to undercut the material that it is cutting into. Such undercutting may be the result of the compression of a conformable contact mask into the hole as it is being formed which may offer protection for the upper portions of the side walls of the openings until a certain depth is reached at which point horizontal etching may form an undercut. Such gripping functionality may also be obtained by modifying the pattern of structural material on the last two or more layers of structure wherein the contacting layer (and maybe one or more additional layers will have relatively small openings in the structural material and one or more previous layers will have wider openings. These smaller and wider openings on different layers may be filled in with a sacrificial material during the layer formation process, which sacrificial material can be removed after layer formation is completed in much the same manner as described with regard to FIGS. 14B and 14C. An example of the formation of these gripping, undercut, or interlocking structures is depicted in FIGS. 15A–15F.

Figure 15A:
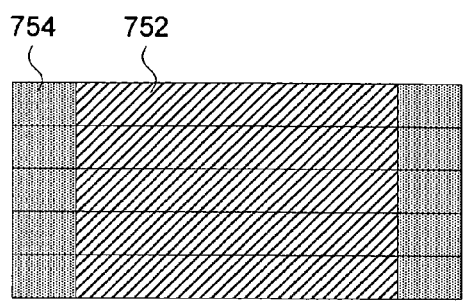
FIGS. 15A–15F schematically depict a process for modifying a configuration of an attachment layer so that it includes reentrant features for enhancing interlocking of the structure and the substrate.

FIG. 15A depicts the last five layers of a sample structure formed by electrochemical fabrication wherein no modification to the configuration of the layers has been made. As indicated, the structure includes regions of structural material 752 and regions of a sacrificial material 754 which are external to the structure itself.

Figure 15B:
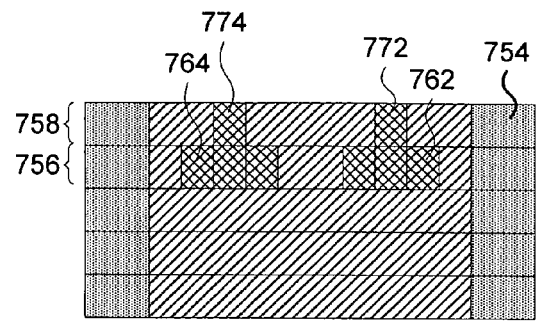

FIG. 15B depicts the last several layers of a structure formed by electrochemical fabrication where the configuration of the last two layers 756 and 758 have been modified to include openings in the structural material that have undercuts or reentrant configurations. As shown in FIG. 15B reentrant structures 762 and 764 as well as channels 772 and 774 that lead to them are temporarily filled with a second sacrificial material that may or may not be the same as the first sacrificial material 754.

Figure 15C:
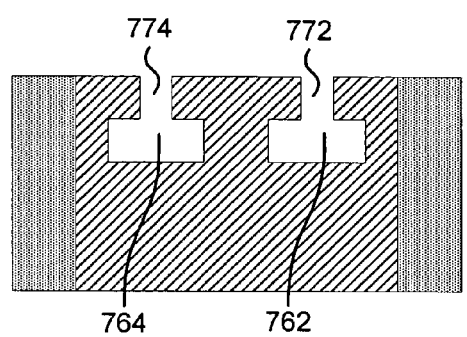

FIG. 15C depicts the pockets and channels of the reentrant structures with the second sacrificial material removed.

Figure 15D:
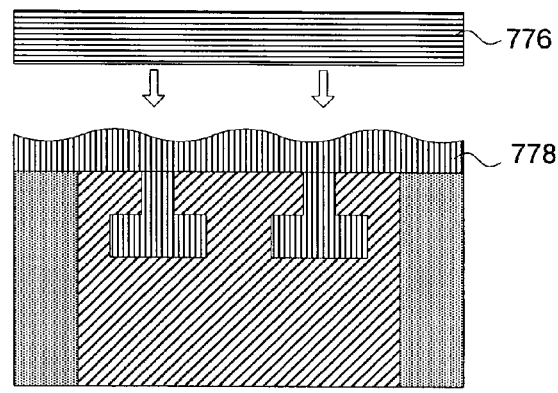

FIG. 15D depicts the structure as being coated with an adhesive 778 and with a swapping substrate 776 located in position for bonding.

Figure 15E:
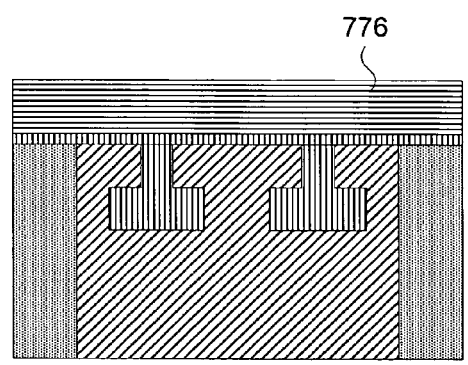

FIG. 15E depicts the state of the process after the swapping substrate 776 has been lowered into position and bonded to the structure via adhesive 778. Not only has bonding occurred between the substrate and the structure, interlocking has occurred between the adhesive and the structure, and if the adhesive has better bonding characteristics with the substrate than the structure then the overall integrity of the combined substrate-structure system has been improved.

Figure 15F:
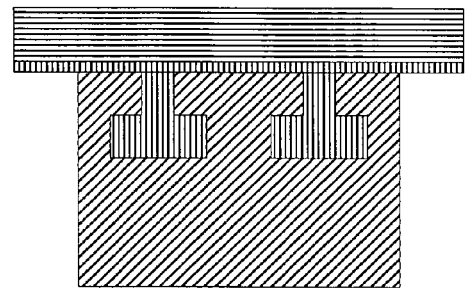

FIG. 15F depicts the state of the process after the external sacrificial material 754 has been removed.

Many alternatives to this interlocking approach as well as the increased surface area approach are possible. In either approach, the interlacing or interlocking elements may extend from a fraction of a layer to multiple layers in height. Instead of using an adhesive to bond the substrate and the structure together, flowable substrate material may have been made to fill the openings after which it would be allowed to solidify or otherwise be made to solidify.

In other embodiments the substrate itself could include openings or reentrant features which could assist in the gripping of an adhesive or filler material to it. In still other embodiments the reentrant features may not be such that any feature alone forms a locking pattern between the substrate and the structure but where a combination of two or more such structures result in a locking configuration (e.g. straight holes extending into the structure at different angles).

In still other embodiments, the two elements to be attached may not include a multi-layer structure and a substrate, they may instead include one or more multi-layer structures in combination with one or more other elements or components that may or may not be multi-layer structures, and may or may not be considered substrate-like.

One embodiment for forming interlock enhanced bonded structures may be summarized as follows: (1) obtain a file descriptive of the structure to be formed; (2) modify the data so as to include one or more branches or channels in the last one or more layers and pockets or reentrant structures in one or more layers that immediately proceed the layers that include the channels; (3) form the structure on a first substrate; (4) etch out the branches and pockets of the reentrant openings; (5) apply a flowable material to the surface of the structure having the branches or channels where this material may be an adhesive if a separate substrate will be bonded by it or it may be a solidifiable material that will be cast or otherwise made to take the shape of a desired substrate; (6) bond a substrate using the adhesive or solidify the substrate material so as to form a substrate that is bonded to the structure; and (7) remove any other sacrificial material the remains and release the first substrate from the structure if desired and if not previously removed.

Many further alternative embodiments are possible and additional examples include: (1) the use of a single sacrificial material to fill the openings as well as the regions external to the structure or to use more then two sacrificial materials; (2) formation of the openings in the structural material in such a way that a sacrificial material is not needed to temporarily fill the openings; and/or (3) use of multiple structural materials. The channels or branches leading to the pockets or reentrant features may have any desired length, they may vary in cross-sectional dimension or they may have variable lengths. The pockets or reentrant features need not have a size difference from that of the channels as they may simply be offset from the position of the channels and in this regard they may actually have smaller cross-sectional area; (5) there need not be a one to one correspondence between pockets and channels; (6) the pockets themselves may have different heights, be located at different depths within the structure and/or have different cross-sectional dimensions.

In alternative embodiments, instead of using undercuts or reentrant features that penetrate into the interior of a structural element, it may be possible to form undercuts on the side walls of regions of structural material which undercuts may be filled with a bonding or substrate material and may act as interlocking elements when considered in association with oppositely oriented undercuts on other portions of the structural material.

In some embodiments, multi-layer structures may be formed starting with a "top" layer (i.e. intended last layer) which is formed adjacent to a temporary substrate, or possibly separated from the temporary substrate by one or more layers of sacrificial material and then adding on subsequent layers until the first layer is reached. In these cases substrate swapping may occur directly by attaching the structural (e.g. permanent substrate) to the last formed layer (e.g. intended first layer) and then, if not already done, the temporary substrate can be removed. In some other embodiments, the multi layer structure can be formed starting with the intended first layer which may be formed directly on a temporary substrate or may be spaced from the temporary substrate by a sacrificial material which may or may not be the same as the sacrificial material that forms part of the layers including structural material. The building may proceed from the first layer to the last layer and if desired one or more layers of sacrificial materials may be formed above the last layer. The sacrificial material above the last layer may or may not be the same as the sacrificial material used in forming the layers that contain both structural and sacrificial materials. If necessary, a second temporary substrate may be attached to the last layer or the layers above it. The first temporary substrate (i.e. the initial substrate) may then be removed. If any layers of sacrificial material exist below the first layer they may be removed and thereafter a permanent (or structural substrate) may be attached to the first layer, after which the second temporary substrate may be removed along with any sacrificial material that has not yet been removed.

In some embodiments, the structural substrates may be rigid while in others they may be flexible. In still other embodiments, the permanent substrates may be integrated circuits or other electrical components to which attachment may be made by one or more of dielectric adhesives, wire bonds, re-flowed solder contacts, and/or other conductive or dielectric elements.

Many other alternative embodiments will be apparent to those of skill in the art upon reviewing the teachings herein.

The patent applications set forth below are hereby incorporated by reference herein as if set forth in full. The gist of each patent application is included to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, now U.S. Pat. No. 6,572,742, and entitled "An Apparatus for Electrochemical Fabrication Comprising A Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. Patent Application No. 60/415,374, filed on Oct. 1, 2002, and entitled "Monolithic Structures Including Alignment and/or Retention Fixtures for Accepting Components" is generally directed to permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. Patent Application No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. Patent Application No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. Patent Application No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thicken. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multi-layer operations of EFAB™.

U.S. Patent Application No. 60/435,324, filed on Dec. 20, 2002, and entitled "EFAB Methods and Apparatus Including Spray Metal or Powder Coating Processes", is generally directed to techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. Patent Application No. 60/429,483, filed on Nov. 26, 2002, and entitled "Multi-cell Masks and Methods and Apparatus for Using Such Masks to Form Three-Dimensional Structures" is generally directed to multilayer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibiting significant deposition or etching.

U.S. Patent Application No. 60/429,484, filed on Nov. 26, 2002, and entitled "Non-Conformable Masks and Methods and Apparatus for Forming Three-Dimensional Structures" is generally directed to electrochemical fabrication used to form multilayer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate whereafter the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. Patent Application No. 60/468,977, filed on May 7, 2003, and entitled "Method for Fabricating Three-Dimensional Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,494, filed on May 7, 2003, and entitled "Methods and Apparatus for Monitoring Deposition Quality During Conformable Contact Mask Plating Operations" is generally directed to a electrochemical fabrication (e.g. EFAB) processes and apparatus are disclosed that provide monitoring of at least one electrical parameter (e.g. voltage) during selective deposition where the monitored parameter is used to help determine the quality of the deposition that was made. If the monitored parameter indicates that a problem occurred with the deposition, various remedial operations may be undertaken to allow successful formation of the structure to be completed.

10/434,289filed on May 7, 2003, and entitled "Conformable Contact Masking Methods and Apparatus Utilizing In Situ Cathodic Activation of a Substrate" is generally directed to an electroplating processes (e.g. conformable contact mask plating and electrochemical fabrication processes) that includes in situ activation of a surface onto which a deposit will be made. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral With Semiconductor Based Circuitry" is generally directed to enhanced electrochemical fabrication processes that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,315, filed on May 7, 2003, and entitled "Methods of and Apparatus for Molding Structures Using Sacrificial Metal Patterns" is generally directed to molded structures, methods of and apparatus for producing the molded structures. At least a portion of the surface features for the molds are formed from multilayer electrochemically fabricated structures (e.g. fabricated by the EFAB™ formation process), and typically contain features having resolutions within the 1 to 100 µm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

U.S. patent application Ser. No. 10/434,103, filed on May 7, 2003, and entitled "Electrochemically Fabricated Hermetically Sealed Microstructures and Methods of and Apparatus for Producing Such Structures" is generally directed to multilayer structures that are electrochemically fabricated from at least one structural material (e.g. nickel), at least one sacrificial material (e.g. copper), and at least one sealing material (e.g. solder). In some embodiments, the layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

U.S. patent application Ser. No. 10/434,497, filed on May 7, 2003, and entitled "Multistep Release Method for Electrochemically Fabricated Structures" is generally directed to multilayer structures that are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

U.S. patent application Ser. No. 10/434,519, filed on May 7, 2003, and entitled "Methods of and Apparatus for Electrochemically Fabricating Structures Via Interlaced Layers or Via Selective Etching and Filling of Voids" is generally directed to multi-layer structures that are electrochemically fabricated by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in: patterns; numbers or existence of or parameters associated with depositions, etchings, and or planarization operations; the order of operations, or the materials deposited). Other embodiments form multi-layer structures using operations that interlace material deposited in association with some layers with material deposited in association with other layers.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use nickel as a structural material while other embodiments may use different materials such as gold, silver, or any other electrodepositable materials that can be separated from the copper and/or some other sacrificial material. Some embodiments may use copper as the structural material with or without a sacrificial material. Some embodiments may remove a sacrificial material while other embodiments may not. In some embodiments, the depth of deposition will be enhanced by pulling a conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the invention will be apparent to those of skill in the art. As such, it is not intended that the invention be limited to the particular illustrative embodiments, alternatives, and uses described above but instead that it be solely limited by the claims presented hereafter.

We claim:

1. An electrochemical fabrication process for producing a three-dimensional structure from a plurality of adhered layers, the process comprising:
   (A) selectively depositing a first material onto a temporary substrate or onto previously deposited material on the temporary substrate to form a portion of a layer and depositing at least a second material to form another portion of the layer, wherein one of the first material or the second material comprises a structural material and the other comprises a sacrificial material, and wherein the depositing of the first material or the second material comprises an electrodeposition operation;

(B) forming the plurality of adhered layers such that successive layers are formed adjacent to and adhered to previously formed layers, wherein said forming comprises repeating (A) a plurality of times to form an embedded structure;

(C) after formation of the plurality of adhered layers, attaching a structural substrate comprising a dielectric material to at least a portion of a layer of the embedded structure and separating the temporary substrate from the embedded structure; and (D) after attaching the structural substrate, removing at least a portion of the sacrificial material from multiple layers and from the embedded structure to release the three-dimensional structure.

2. The process of claim 1 additionally comprising:

supplying a plurality of preformed masks, wherein each mask comprises a patterned dielectric material that includes at least one opening through which deposition can take place, and wherein each mask comprises a support structure that supports the patterned dielectric material, wherein for a plurality of layers, the forming of adhered layers in (B) further comprises:
  (1) contacting the previously deposited material and the dielectric material of a selected preformed mask;
  (2) in the presence of a plating solution, conducting an electric current through the at least one opening in the selected mask between an anode and the previously deposited material, wherein the previously deposited material functions as a cathode, such that the first material is deposited onto the previously deposited material to form at least the portion of a layer; and
  (3) separating the selected preformed mask from the previously deposited material.

3. The process of claim 1 wherein for a plurality of layers the forming of adhered layers in (B) further comprises:
  (1) providing an adhered patterned mask on a surface of the previously deposited material, wherein the mask includes at least one opening;
  (2) in the presence of a plating solution, conducting an electric current through the at least one opening in the adhered mask between an anode and the previously deposited material, wherein the previously deposited material functions as a cathode, such that the first material is deposited onto the previously deposited material to form at least the portion of a layer; and
  (3) removing the mask from the previously deposited material.

4. The process of claim 1 wherein the attaching comprises placing a dielectric adhesive onto at least one of (i) the structural substrate or (ii) the at least a portion of the layer to which attachment is to occur and then bringing the structural substrate and the at least a portion of the layer into contact.

5. The process of claim 1 wherein the structural substrate further comprises a preformed sheet.

6. The process of claim 1 wherein the structural substrate further comprises a flowable material that is contacted to the at least a portion of the layer and is thereafter allowed to solidify or is made to solidify.

7. The process of claim 6 wherein the flowable material comprises a pre-polymer.

8. The process of claim 7 wherein the pre-polymer comprises a two-part epoxy.

9. The process of claim 1 wherein the structural substrate further comprises a flexible material.

10. The process of claim 1 wherein the attaching causes the structural substrate to at least partially surround at least a portion of a layer of the deposited structural material.

11. The process of claim 1 wherein the attaching of the structural substrate occurs prior to the separation of the temporary substrate.

12. The process of claim 11 wherein the first material comprises the structural material and the second material comprises the sacrificial material.

13. The process of claim 1 wherein the attaching of the structural substrate to the embedded structure comprises a mechanical interlocking of portions of the structural substrate with portions of the embedded structure.

14. The process of claim 1 wherein the attaching of the structural substrate occur after the separation of the temporary substrate.

15. The process of claim 1 wherein the second material comprises the structural material and the first material comprises the sacrificial material.

16. The process of claim 1 wherein a portion of the sacrificial material is removed prior to attaching the structural substrate.

17. The process of claim 16 wherein at least a portion a region from which the sacrificial material is removed prior to attaching the structural substrate is filled with a dielectric material.

18. The process of claim 1 wherein the attaching of the structural substrate occurs after separating a portion of the temporary substrate from the embedded structure.

19. The process of claim 1 wherein upon release of the embedded structure from the sacrificial material the structural material is also released from the temporary substrate.

20. The electrochemical fabrication process of claim 1 wherein the removing of at least a portion of the sacrificial material removes sacrificial material from a plurality of the layers.

21. An electrochemical fabrication process for producing a three-dimensional structure from a plurality of adhered layers, the process comprising:

(A) selectively depositing a first material onto a first temporary substrate or onto previously deposited material on the first temporary substrate to form a portion of a layer and depositing at least a second material to form another portion of the layer, wherein one of the first material or the second material comprises a structural material and the other comprises a sacrificial material, and wherein the depositing of the first material or the second material comprises an electrodeposition operation;

(B) repeating (A) a plurality of times to form the plurality of adhered layers such that successive layers are formed adjacent to and adhered to previously formed layers to produce an embedded structure;

(C) after formation of the plurality of adhered layers attaching a second temporary substrate, which comprises a dielectric material, to at least a portion of a layer of the embedded structure and separating the first temporary substrate from the embedded structure and then attaching a structural substrate to at least a portion of a layer of the embedded structure that at least partially overlaps a location that was occupied by the first temporary substrate; and (D) after attaching the second temporary substrate, removing at least a portion of the sacrificial material from multiple layers and from the embedded structure to release the three-dimensional structure.

22. The electrochemical fabrication process of claim 21 wherein the removing of at least a portion of the sacrificial material removes sacrificial material from a plurality of the layers.

23. An electrochemical fabrication process for producing a three-dimensional structure, the process comprising:
   (A) selectively depositing a first material onto a temporary substrate or onto previously deposited material on the temporary substrate to form a portion of a layer and depositing at least a second material to form another portion of the layer, wherein one of the first material or the second material comprises a structural material and the other comprises a sacrificial material, and wherein the depositing of the first material or the second material comprises an electrodeposition operation;
   (B) forming a plurality of adhered layers such that each successive layer is formed adjacent to and adhered to a previously formed layer, wherein said forming comprises repeating (A) a plurality of times to produce an embedded structure;
   (C) after formation of the plurality of layers attaching a structural substrate, comprising a plurality of materials and/or a patterned structure, to at least a portion of a layer of the embedded structure and separating the temporary substrate from the embedded structure; and
   (D) after attaching the structural substrate, removing at least a portion of the sacrificial material from multiple layers and from the embedded structure to release the three-dimensional structure.

24. The process of claim 23 wherein for a plurality of layers the forming of adhered layers in (B) further comprises:
   (1) providing an adhered patterned mask on a surface of the previously deposited material, wherein the mask includes at least one opening;
   (2) in the presence of a plating solution, conducting an electric current through the at least one opening in the adhered mask between an anode and the previously deposited material, wherein the previously deposited material functions as a cathode, such that the first material is deposited onto the previously deposited material to form at least the portion of a layer; and
   (3) removing the mask from the previously deposited material.

25. The electrochemical fabrication process of claim 23 wherein the removing of at least a portion of the sacrificial material removes sacrificial material from a plurality of the layers.

26. An electrochemical fabrication process for producing a three-dimensional structure from a plurality of adhered layers, the process comprising:
   (A) selectively depositing a first material onto a first temporary substrate or onto previously deposited material on the first temporary substrate to form a portion of a layer and depositing at least a second material to form another portion of the layer, wherein one of the first material or the second material comprises a structural material and the other comprises a sacrificial material, and wherein the depositing of the first material or the second material comprises an electrodeposition operation;
   (B) repeating (A) a plurality of times to form a plurality of layers such that successive layers are formed adjacent to and adhered to previously deposited layers to form an embedded structure;
   (C) after formation of the plurality of adhered layers attaching a second temporary substrate, which comprises a plurality of materials and/or comprises a patterned structure, to at least a portion of a layer of the embedded structure and separating the first temporary substrate from the embedded structure and then attaching a structural substrate to at least a portion of a layer of the embedded structure that at least partially overlaps a location that was occupied by the first temporary substrate; and
   (D) after attaching the second substrate, removing at least a portion of the sacrificial material from multiple layers and from the embedded structure to release the three-dimensional structure.

27. The electrochemical fabrication process of claim 26 wherein the removing of at least a portion of the sacrificial material removes sacrificial material from a plurality of the layers.

28. An electrochemical fabrication process for producing a multi-part three-dimensional structure, the process comprising:
   (A) forming at least one part of the multi-part structure, comprising:
      (1) selectively depositing a first material onto a substrate or onto previously deposited material on the substrate to form a portion of a layer and depositing at least a second material to form another portion of the layer, wherein one of the first material or the second material comprises a structural material and the other comprises a sacrificial material, and wherein the depositing of the first material or the second material comprises an electrodeposition operation;
      (2) forming a plurality of adhered layers such that successive layers are formed adjacent to and adhered to previously formed layers, wherein said forming comprises repeating (1) a plurality of times;
   (B) supplying at least one additional part of the multi-part structure;
   (C) attaching the at least one part to the at least one additional part to form an embedded structure; and
   (D) after attaching the at least one part and the at least one additional part, removing at least a portion of the sacrificial material from multiple layers and from the embedded structure to release a multi-part three-dimensional structure.

29. The electrochemical fabrication process of claim 28 additionally comprising separating the embedded structure from the substrate.

30. The electrochemical fabrication process of claim 28 wherein the removing of at least a portion of the sacrificial material removes sacrificial material from a plurality of the layers.

* * * * *